(12) United States Patent
Park et al.

(10) Patent No.: US 7,001,697 B2
(45) Date of Patent: Feb. 21, 2006

(54) PHOTOMASK HAVING A TRANSPARENCY-ADJUSTING LAYER, METHOD OF MANUFACTURING THE PHOTOMASK, AND EXPOSURE METHOD USING THE PHOTOMASK

(75) Inventors: Jong-Rak Park, Chungju (KR); Seong-Woon Choi, Suwon (KR); Gi-Sung Yeo, Seoul (KR); Sung-Hoon Jang, Ansan (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 317 days.

(21) Appl. No.: 10/623,616

(22) Filed: Jul. 22, 2003

(65) Prior Publication Data

US 2004/0067422 A1    Apr. 8, 2004

(30) Foreign Application Priority Data

Oct. 7, 2002    (KR) ...................... 10-2002-0061046

(51) Int. Cl.
G01F 9/00    (2006.01)

(52) U.S. Cl. ........................................................ 430/5
(58) Field of Classification Search .................. 430/5, 430/30; 359/558, 559
See application file for complete search history.

(56) References Cited

U.S. PATENT DOCUMENTS

| 5,387,484 A | * | 2/1995 | Doany et al. .................. 430/5 |
| 5,624,773 A | | 4/1997 | Pforr et al. | |

FOREIGN PATENT DOCUMENTS

| JP | 10-161297 | 6/1998 |
| KR | 1999-0065144 | 8/1999 |

* cited by examiner

*Primary Examiner*—S. Rosasco
(74) *Attorney, Agent, or Firm*—Volentine Francos & Whitt, PLLC

(57) ABSTRACT

A photomask for use in photolithography has substrate, a main pattern at one side of the substrate, and a transparency-adjusting layer at the other side of the substrate. The transparency-adjusting layer has a characteristic that allows it to change the intensity of the illumination incident on the main pattern during the exposure process accordingly. In manufacturing the photomask, a first exposure process is carried out on a wafer using just the substrate and main pattern. The critical dimensions of elements of the pattern formed on the wafer as a result of the first exposure process are measured. Differences between these critical dimensions and a reference critical dimension are then used in designing a layout of the transparency-adjusting layer in which the characteristic of the layer is varied to compensate for such differences.

36 Claims, 13 Drawing Sheets

PHOTOMASK HAVING A TRANSPARENCY-ADJUSTING LAYER, METHOD OF MANUFACTURING THE PHOTOMASK, AND EXPOSURE METHOD USING THE PHOTOMASK

BACKGROUND OF THE INVENTION

1. Field of the Invention

The present invention relates to the process of photolithography used to manufacture semiconductor devices. More particularly, the present invention relates to a photomask of an exposure apparatus of photolithographic equipment, and to a method of manufacturing the photomask.

2. Description of the Related Art

Photolithographic techniques have been widely used, in the manufacturing of semiconductor devices, to form patterns on a wafer by transcribing a pattern of a photomask onto a wafer. In these techniques, a photoresist layer is formed on the wafer. The photoresist layer is exposed to light directed through the photomask, whereby an image corresponding to the pattern of the photomask is formed on the photoresist layer. The exposed photoresist layer is then developed, which process patterns the photoresist layer. Then, a layer(s) underlying the photoresist layer is/are etched using the patterned photoresist layer as a mask to thereby pattern the underlying layer(s).

Moreover, the design rules for manufacturing these devices are constantly decreasing to meet the demand for semiconductor devices having higher integration densities. However, limits in the resolution of the exposure process of photolithography pose serious obstacles to manufacturing semiconductor devices having highly integrated circuit patterns. In particular, the uniformity that can be attained in the dimensions of the pattern formed on the wafer is limited by the resolution that can be attained in current photolithographic exposure techniques.

Furthermore, the same photomask is used in photolithography to form a pattern whose elements all have the same (critical) dimension. Nonetheless, the dimensions of these elements of the pattern may vary considerably depending on the place on the wafer where each of the elements is formed. This is because the uniformity of the dimensions of patterns formed on a wafer using a common mask is affected by various factors including the processes by which the photoresist layer is formed, e.g. coating and baking processes, the characteristics of the exposure apparatus including those of the photomask, the process by which the photoresist layer is developed, and the process by which layer(s) underlying the patterned photoresist layer is/are etched. The shot uniformity or in-field uniformity, namely, the differences between corresponding dimensions within the pattern formed on the wafer, is especially dependent upon the characteristics of the exposure apparatus and photomask.

Thus, various ways to increase the resolution of the exposure process have long been a matter of concern in the field. For example, the use of a diffraction grating or a filter to vary the illumination produced by the light source throughout the course of the exposure process has gained in popularity among photolithography techniques aimed at increasing the resolution of the process. However, this technique has not been found to be entirely successful in increasing the uniformity of the dimensions of patterns on a wafer. Also, efforts at reducing a difference in the critical dimensions of each of the constituent elements of a pattern on a wafer have been undertaken by providing the photomask with a filter, using a laser pulse as exposure light, and varying the energy of the laser pulse. However, such efforts are far from being put to practical use because of the difficulty in freely varying the intensity of the laser pulses to the extent required to attain uniformity in the critical dimensions.

SUMMARY OF THE INVENTION

Accordingly, an object of the present invention is to improve the uniformity of the critical dimensions of a pattern that can be formed on a wafer by photolithography without the need to make any considerable changes in the illumination system used in the photolithographic apparatus. To this end, the present invention provides the improvements at the photomask level. In particular, the present invention provides a photomask capable of producing a pattern having highly uniform critical dimensions on a wafer when used in a typical exposure process, a method of manufacturing the photomask, and an exposure method using the photomask.

The photomask includes a transparent photomask substrate, a main mask pattern to be transferred onto the wafer disposed on the front side of the photomask substrate, and a transparency-adjusting layer disposed on a rear side of the photomask substrate. The transparency-adjusting layer produces slight changes in the intensities of light beams, which are directed through the photomask substrate and are incident on the main pattern. The characteristics of the transparency-adjusting layer is designed to produce a higher degree of uniformity in the pattern transferred onto the wafer through the exposure process than if the exposure process were carried out using the same photomask without the transparency-adjusting layer.

According to one aspect of the present invention, the transparency-adjusting layer may be a patterned layer comprising sets of transparency-adjusting pattern features respectively provided in sections of a region at the rear side of the substrate. In this case, the above-mentioned changes in the intensity of the light beams (illumination) can be effected by variations in the densities of the sets of the transparency-adjusting pattern features. For example, the intensity of the illumination can be reduced by as much as 50% by a set of the transparency-adjusting pattern features provided at a sufficiently high density. The transparency-adjusting pattern layer, however, is preferably formed so that the intensity of the illumination is reduced by a maximum of about 20% and such that the shape of the illumination is hardly changed. For example, in a case in which the form of the illumination used in the exposure process is annular, the densities of the sets of the transparency-adjusting pattern features vary, amongst the sets, by about 5% maximum. Accordingly, the intensity of the illumination will be changed by the features but the annular form thereof is preserved to a major extent.

According to another aspect of the present invention, a method of manufacturing such a photomask begins by providing a photomask that includes just the substrate and the main pattern located at the front side of the substrate, and transferring an image of the main pattern to a wafer by performing an exposure process in which illumination is directed onto the wafer through the photomask. The image of the main pattern is used to produce a pattern on the wafer formed of elements having respective corresponding critical dimensions. Then, the critical dimensions are measured or otherwise quantified to obtain a distribution of values of the critical dimensions on the wafer. A reference critical dimension value may then be selected based upon the critical dimension values. Preferably, the lowest one of the critical dimension values is selected as the reference critical dimension value.

The critical dimension values are compared with the reference critical dimension value in order to ascertain the respective differences therebetween.

A correlation is obtained between the densities of the transparency-adjusting pattern features, in terms of their size and spacing, and the changes that the transparency-adjusting pattern features provided at those densities at the rear side of the substrate would make in the intensity of the illumination directed through the features during the same exposure process. Also, the degrees to which the intensity of the illumination used in the exposure process would need to be decreased in order to reduce the differences, respectively, between the critical dimension values and the reference critical dimension value are determined with reference to localities on the photomask. Accordingly, a distribution of the degrees to which the intensity of the illumination needs to be reduced is obtained.

Then, based on the correlation described above, the densities of the transparency-adjusting pattern features that correspond to the distribution of the degrees to which the intensity of the illumination needs to be decreased, are obtained, thereby providing a distribution of the densities of the transparency-adjusting pattern features in relation to the localities on the photomask. Finally, the transparency-adjusting pattern layer is formed on the rear side of the photomask in accordance with the above-mentioned, distribution of the densities. Preferably, the transparency-adjusting patterns each have a size of about 0.8 µm (the largest dimension thereof).

Preferably, the correlation between the densities of the transparency-adjusting pattern features and the changes that the transparency-adjusting pattern features would make in the intensity of the illumination is produced using a Fourier transform. In this case, transparency-adjusting pattern features having an arbitrary size and spacing therebetween are formed on the rear side of the photomask substrate. A Fourier transform of the images of the transparency-adjusting pattern features provides the intensity of the modified illumination incident on the main pattern as a function of the size and the spacing of the arbitrary arrangement of the transparency-adjusting pattern features. Then, based on this function, a correlation is obtained between the densities of the transparency-adjusting pattern features, represented by $$\frac{\text{(the size of the features)}^2}{\text{(the spacing of the features)}^2},$$

and the changes that the transparency-adjusting pattern features would-make in the intensity of the illumination during the exposure process. Preferably, the intensity of illumination is represented by $$1 - \frac{4\text{(the size of the features)}^2}{\text{(the spacing of the features)}^2}$$

in this function.

Preferably, the degrees to which the intensity of the illumination used in the exposure process would need to be decreased are determined using dose latitude (D_L) values. The dose latitude values are representative of variations in a critical dimension of a pattern formed by an exposure process with respect to changes in the dose of the illumination used to form the pattern. Exposure dose variations, corresponding to the differences between the critical dimension values and the reference critical dimension value, are calculated using the dose latitude values and the differences between the critical dimension values and the reference critical dimension value.

The transparency-adjusting pattern features may be recesses formed by selectively etching the rear side of the photomask substrate. The recesses have a predetermined size and depth so that light passing through the recesses has a phase that is different from that of the light passing through other portions of the rear side of the photomask substrate. The recesses cause the light passing therethrough to diffract or undergo interference with the light passing through the other portions of the rear side of the photomask substrate.

According to another aspect of the present invention, the transparency-adjusting pattern features are formed by a patterned (shielding) layer of material capable of reflecting or absorbing the incident illumination. These features are formed by covering the rear side of the photomask substrate with a layer of the material and then selectively etching the layer. Preferably, the material comprises chromium.

According to yet another aspect of the present invention, the transparency-adjusting layer may be provided on a transparent auxiliary mask substrate disposed on the rear side of the photomask substrate, whereby the transparency-adjusting pattern features are formed on the auxiliary mask substrate.

According to still another aspect of the present invention, the transparency-adjusting layer may be a layer of light-absorbing material formed on the rear side of the photomask substrate and having a thickness that varies in correspondence with the degrees to which the intensity of the illumination needs to be decreased.

The exposure method of the present invention begins by first providing a typical photomask, and then correcting the photomask, i.e., by manufacturing a photomask as described above. Thus, first, a photomask is provided that includes a substrate having a front side and a rear side, and a main pattern located at said front side of the substrate. An image of the main pattern is transferred to a wafer in a first exposure process, and the image is used to produce a pattern on the wafer. The values of the critical dimensions of the pattern are compared to a reference critical dimension value in order to ascertain the differences therebetween. Then, the degrees to which the intensity of the illumination used in the first exposure process would need to be decreased in order to reduce the differences, respectively, between the critical dimension values and the reference critical dimension value, are determining in relation to localities on the photomask, thereby obtaining a distribution of these degrees in relation to the localities on the photomask. A transparency-adjusting layer is then formed on the rear side of the photomask substrate. The transparency-adjusting layer is capable of changing the intensity of illumination directed through the rear side of the photomask. The characteristics of the transparency-adjusting layer with respect to its ability to change the intensity of the illumination vary in accordance with the distribution of the degrees to which the intensity of the illumination used in the exposure process needs to be decreased; and Secondly, the photomask so corrected is used in a second exposure process, namely that which is used in the manufacturing of actual devices from the wafer. In this phase of the process, therefore, the image of the main pattern is directed onto a wafer using the photomask substrate having the transparency-adjusting layer at the rear side thereof. Preferably, the second exposure process is performed under the same conditions, in terms of the illumination used, as the first exposure process.

Accordingly, the uniformity of the critical dimensions of the pattern formed on a wafer by the second exposure process is improved, in comparison with that which was attained using the first exposure process. Yet the second exposure process can be carried out using the same illumination system as the first exposure process.

BRIEF DESCRIPTION OF THE DRAWINGS

The above and other objects, features and advantages of the present invention will become more apparent by referring to the following detailed description of the preferred embodiments thereof made with reference to the attached drawings, in which.

DETAILED DESCRIPTION OF THE PREFERRED EMBODIMENTS

Figure 1:
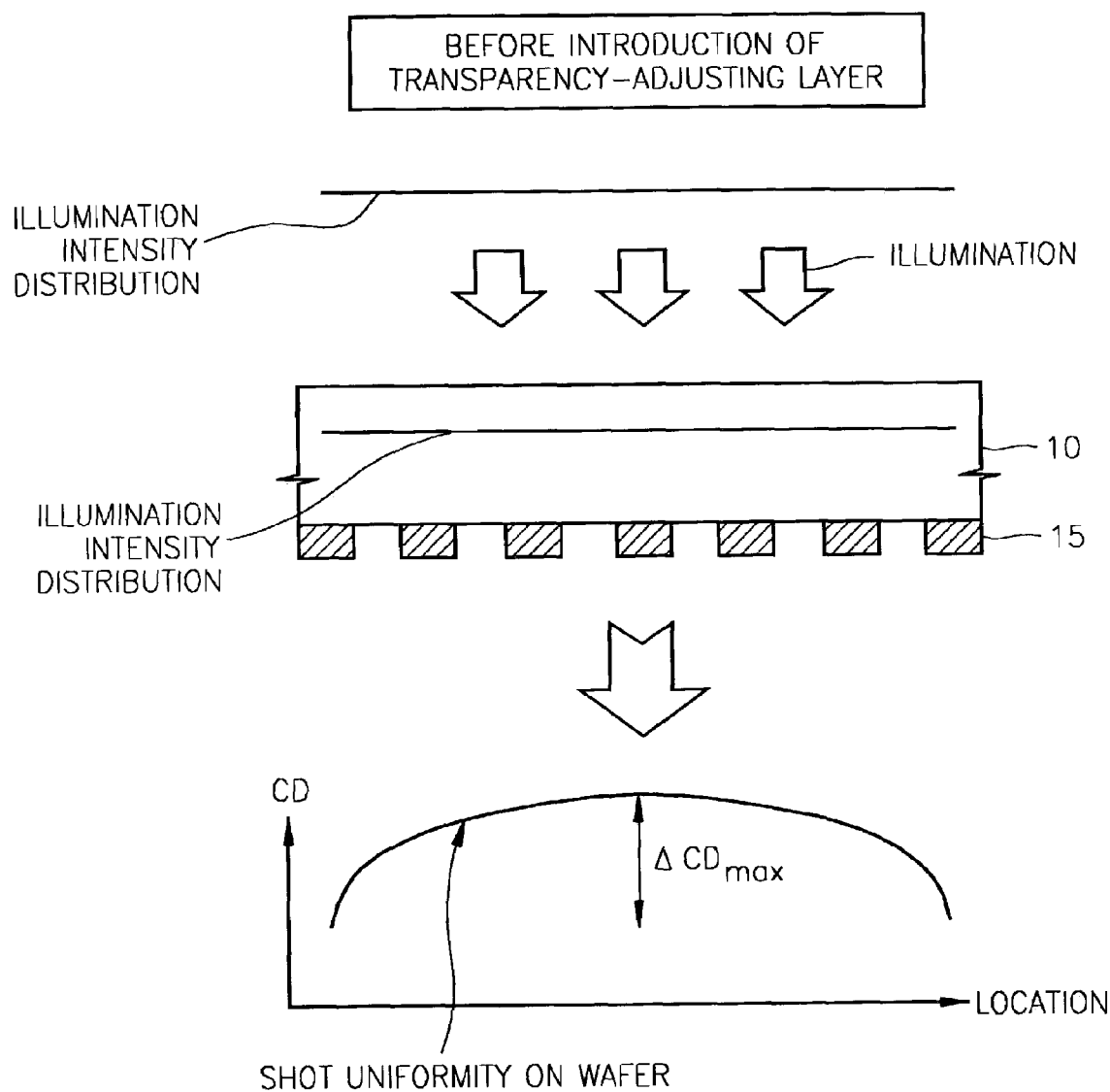
FIG. 1 is a conceptual diagram illustrating an exposure process using a conventional photomask.

The present invention will be described more fully with reference to the accompanying drawings. In the drawings, the thickness of layers and regions are exaggerated for clarity. It will also be understood that when a layer is referred to as being "on" another layer or substrate, such a description includes both the layer in question being disposed directly on the other layer or substrate, or intervening layers being present therebetween. Also, the same reference numerals are used to represent the same elements throughout the drawings.

Figure 2:
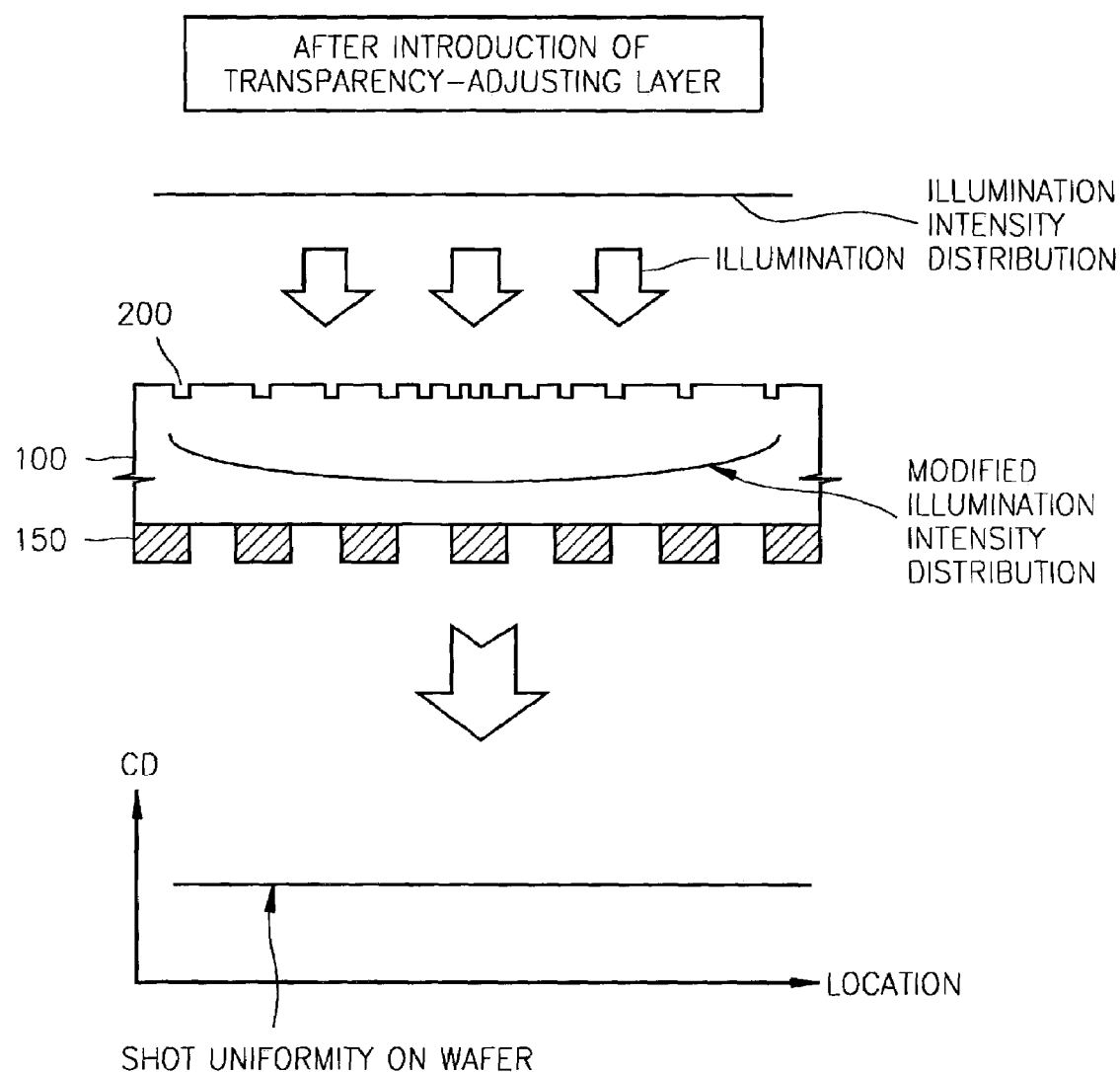
FIG. 2 conceptual diagram illustrating an exposure process using a photomask according to the present invention.

The present invention will now be described in general with reference to FIGS. 1 and 2. FIG. 1 shows an exposure process using a typical photomask, and FIG. 2 shows an exposure process using a photomask according to the present invention. The exposure processes illustrated in FIGS. 1 and 2 each comprise illuminating the respective photomasks with exposure light having a uniform intensity distribution. Also, the exposure processes are the same in terms of the form of the exposure light used and the parameters of the lenses by which the exposure light is projected onto the wafers.

As shown in FIG. 1, the conventional photomask consists of a mask substrate 10 and a main pattern 15 formed on the front of the substrate 10. Light beams incident on the photomask substrate 10 pass through the photomask substrate 10 and are incident on the main pattern 15. An image identical to that of the main pattern 15 should be transferred to the wafer by the exposure process seeing that the intensity of the light beams illuminating the photomask has a uniform distribution. However, actual measurements on the wafer reveal a very, low shot uniformity or in-field uniformity, as shown in FIG. 1. That is, the critical dimension (CD) vanes among the constituent elements of the pattern.

In a preferred embodiment of the present invention, a transparency-adjusting pattern layer is provided on a rear side of the photomask substrate 100 in order to correct for such variations in critical dimensions. The transparency-adjusting pattern layer includes transparency-adjusting pattern features 200, and the density of these transparency-adjusting pattern features 200 varies across the rear side of the substrate 100.

Referring now to FIG. 2, the rear side of the photomask substrate 100 is illuminated with light beams having a uniform intensity distribution. The transparency-adjusting pattern features 200 formed on the rear side of the photomask substrate 100 are capable of inducing a phase difference in the incident light beams or are capable of reflecting or absorbing incident light beams so as to change the intensity of the light beams passing through the photomask substrate 100. Accordingly, the transparency-adjusting pattern features 200 cause the light beams incident on the rear side of the photomask substrate 100 to diffract or interfere with one another.

As a result, the distribution of the intensity of the light beams passing through the substrate 100 of the photomask substrate 100 is changed. The light beams having such a changed intensity distribution are incident on the main pattern 150 provided on the front side of the photomask substrate 100 and transfer the image of the main pattern 150 onto a wafer. Although the sources of illumination for the photomasks are the same in the processes illustrated in FIGS. 1 and 2, the image of the main pattern 150 is transferred to the wafer differently from that of the conventional process illustrated in FIG. 1 because light beams having different intensities are incident on the main patterns 150.

The distribution of the transparency-adjusting pattern features 200 can be designed to improve the uniformity of the critical dimensions shown in FIG. 1. More specifically, the transparency-adjusting pattern layer is designed considering the fact that the critical dimension of the pattern that will be formed on the wafer depends on the dose of the exposure light. The transparency-adjusting pattern features 200 are distributed to vary the conditions under which the main pattern 150 is illuminated, whereby a variation in the dose of the exposure light is provided.

Figure 3:
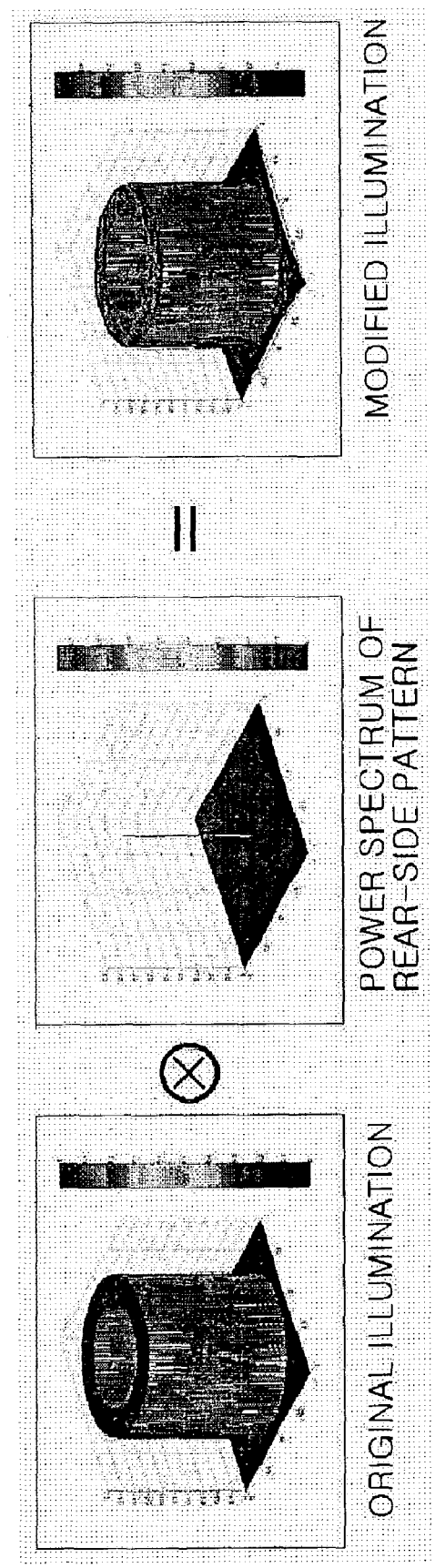
FIG. 3 is a conceptual diagram illustrating the modification of illumination by a transparency-adjusting pattern layer of a photomask according to the present invention.

FIG. 3 illustrates in more detail the modification of illumination due to the use of a transparency-adjusting pattern layer according the present invention. The original form of the illumination depends on characteristics of the illumination system (exposure apparatus) that is being employed. For convenience, the process will be described with respect to an annular form of the original illumination, as shown at the left-hand side of FIG. 3. In this case, an annular light beam is coupled with the power spectrum of the transparency-adjusting pattern features 200 so that the light beams are modified, as shown at the right-hand side of FIG. 3. The image of the main pattern 150 is transferred to the wafer by the modified light beams. The dose of the exposure light on the main pattern 150 is adjusted because of the effect that the power spectrum of the transparency-adjusting pattern has on the original form of the illumination.

However, an exposure process using the typical photomask 10 shown in FIG. 1 can hardly be expected to produce a pattern or patterns in which the differences among the critical dimensions will have a specific regular distribution. Accordingly, the transparency-adjusting pattern features 200 must be designed to account for an irregular distribution of the differences among the critical dimensions that would otherwise be present in the pattern(s) produced on the wafer. To this end, a Fourier spectrum of the modified light beams, which would reach the wafer after passing through the transparency-adjusting pattern features 200, may be used to model the transparency-adjusting pattern features 200. A Fourier spectrum can be obtained through the use of a Fourier transform.

Figure 4:
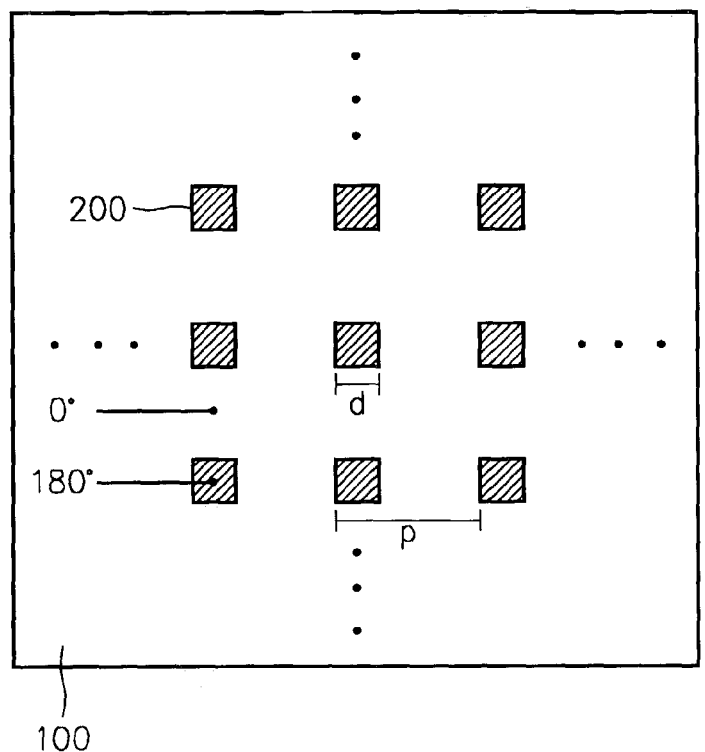
FIG. 4 is a conceptual diagram of an arbitrary arrangement of transparency-adjusting pattern features in a specific region of the rear surface of a photomask according to the present invention.

FIG. 4 illustrates transparency-adjusting pattern features 200 having a predetermined density in a specific region at the rear side of a photomask according to the present invention. In particular, the transparency-adjusting pattern elements 200 have a predetermined size (d) and are spaced a predetermined distance (p) from one another. Also, the transparency-adjusting pattern features 200 induce a phase difference in light beams passing through the rear surface of the photomask. In this case, the transparency-adjusting pattern features 200 may be rectangular recesses formed in the rear side of the photomask substrate 100. However, the transparency-adjusting pattern features 200 may have other shapes.

In either case, the magnitude of the phase difference corresponds to the depth of the recesses constituting transparency-adjusting pattern features 200. For example, the recesses may have a predetermined depth such that they will induce a 180° phase difference in light beams passing through the photomask substrate 100.

That is, in this example, light beams passing through the outermost part of the rear surface of the photomask substrate 100 have a phase of 0°, and light beams passing through the transparency-adjusting pattern elements 200 have a phase of 180°. The phase difference of these light beams results in interference or diffraction.

As mentioned above, the Fourier spectrum of the light beams reaching the wafer after being so modified can be determined using a Fourier transform. In particular, a Fourier transform expression can be obtained for each image of the transparency-adjusting features 200 shown in FIG. 4, and a Fourier transform for the arrangement of the transparency-adjusting pattern features 200 can be obtained according to a convolution theorem-using the Fourier transform expressions for each of the images of the transparency-adjusting pattern features 200. Supposing that light beams incident on the wafer are expressed as not having any higher-order term, the Fourier transform function is expressed by $$\left(1 - \frac{2d^2}{p^2}\right),$$

wherein $$\left(1 - \frac{2d^2}{p^2}\right)^2$$

represents the intensity of exposure light, which approximates $$\left(1 - \frac{4d^2}{p^2}\right).$$

The Fourier transform function shows that the intensity of light passing through the transparency-adjusting pattern features 200 is dependent on the size (d) of the transparency-adjusting pattern features 200 and the distance (p) between neighboring transparency-adjusting pattern elements 200. Theoretically, the result of the Fourier transform indicates that a maximum decrease in the intensity of exposure light is up to four times as great as the density $$\left(\frac{d^2}{p^2}\right)$$

of the transparency-adjusting pattern features 200, given that higher-order terms are not considered and the transparency-adjusting pattern features 200 have a sufficiently low density. In fact, given that higher-order terms cannot be 0, a plot of the relationship between the intensity of the modified illumination with respect to the density of the transparency-adjusting pattern features 200 has a slope of less than 4.

Figure 5:
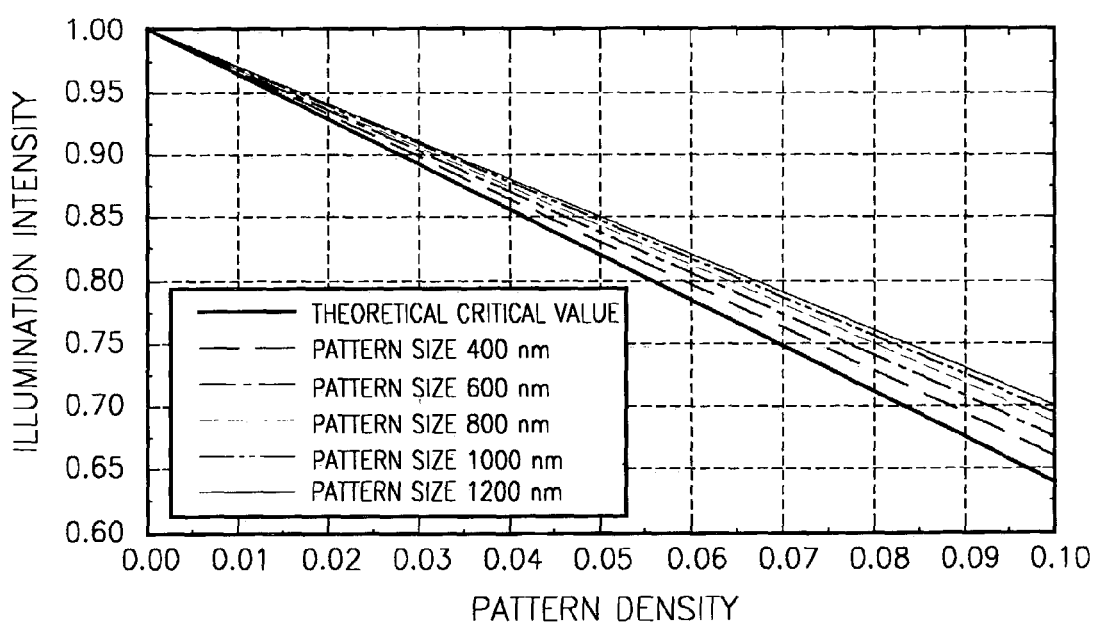
FIG. 5 is a graph showing relationships between the modified intensity of the illumination and the density of the transparency-adjusting pattern features used to so modify the illumination according to the present invention.

FIG. 5 is a graph showing the relationship between the intensity of the modified illumination with respect to the density of the transparency-adjusting pattern features 200 used to so modify the intensity of the illumination. In particular, FIG. 5 shows a correlation between the density of transparency-adjusting pattern features 200 of different sizes and the intensity of the modified illumination. In FIG. 5, the intensity of the illumination is expressed as a normalized value. Also, the plots in FIG. 5 were generated on the basis of an optical system having a numerical aperture (NA) of 0.7 and producing illumination having an annular form of 0.55–0.85 and a wavelength of 248 nm.

FIG. 5 shows that the magnitude in the intensity of the modified illumination is dependent on the density of the transparency-adjusting pattern elements 200. As each of the transparency-adjusting features 200 becomes smaller, the slope of normalized illumination density versus pattern density becomes closer to a theoretical critical value. More particularly, as each of the transparency-adjusting pattern features 200 becomes smaller, the effect of diffraction becomes greater, which effect is considered as responsible for decreases in the values of higher-order terms.

FIG. 5 thus shows that it is possible to vary the intensity of the exposure light by varying the size (d) of each of the transparency adjusting pattern features 200 and the distance (p) between neighboring transparency-adjusting pattern features 200. Thus, the present invention makes it is possible to expose respective regions of the wafer with light of different intensities.

Figure 6:
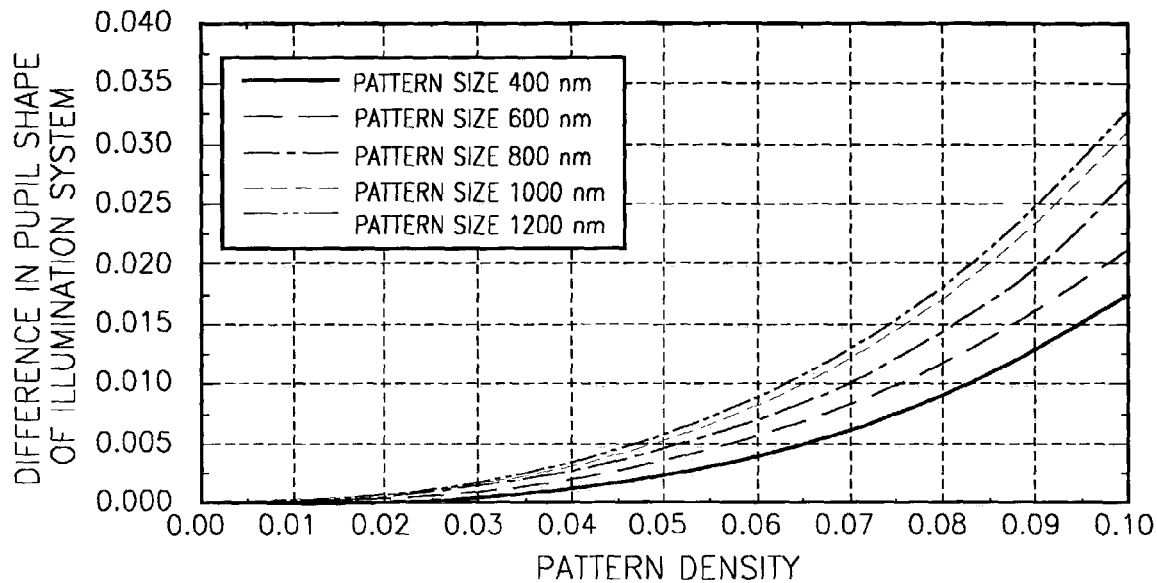
FIG. 6 is a graph showing the effect that the size and density of transparency-adjusting pattern features has on the shape of the pupil of an illumination system.

However, it should be noted that the final design of the transparency-adjusting pattern features 200 should not cause a severe change in the shape of the pupil of the optical system in which the photomask is an integral part. If the shape of the pupil is changed too much, lens flare may increase thereby causing defects in the image projected onto the wafer. FIG. 6 is a graph showing the variation of the shape of a pupil of the illumination system with respect to the size and density of transparency-adjusting pattern features. As was the case with FIG. 5, the plots in FIG. 6 were generated on the basis of an optical system having a numerical aperture (NA) of 0.7 and producing illumination having an annular form of 0.55–0.85 and a wavelength of 248 nm.

The change in the shape of the pupil of illumination can be expressed by $$\frac{\sum_{i,j}\left(A_{ij} - \frac{B_{ij}}{NII}\right)^2}{\sum_{i,j} A_{ij}^2},$$

wherein $A_{ij}$ represents the shape of the pupil at that part of the illumination system providing the original form of the illumination, $B_{ij}$ represents the shape of the pupil at that part of the system producing the modified form of illumination, and NII represents a normalized value of the intensity of the illumination.

As shown in FIG. 6, as the size of each of the transparency-adjusting pattern features 200 decreases, the shape of the pupil of the illumination system varies less and less. Accordingly, forming smaller transparency-adjusting pattern features 200 is effective in view of preventing the undesirable effects of lens flare from occurring.

Referring now to both FIGS. 5 and 6, the intensity of the exposure light can be decreased more effectively by forming smaller and smaller transparency-adjusting pattern features 200 even when the density of the transparency-adjusting pattern features 200 is low. In addition, it is easier to maintain the shape of the original illumination when the transparency-adjusting pattern features 200 are relatively small. Accordingly, the transparency-adjusting pattern features 200 are preferably formed to have the smallest appropriate size that can be achieved by current pattern-forming mass-production technology. For example, in an exposure process in which an exposure light dose of 130 mJ is applied, the transparency-adjusting pattern features 200 would have a size of 800 nm. A correlation was obtained experimentally between the intensity of the modified exposure light and the density of transparency-adjusting pattern features 200 having a size of 800 nm. The plot of this correlation, as laid out in the manner shown in FIG. 5, had a slope of −3.2.

The analysis that has been described above with reference to FIGS. 3 through 6 shows that the transparency-adjusting pattern features 200 can be laid out in a final arrangement to alter the degrees of transparency of the photomask substrate 100 without significantly changing the shape of the illumination. That is, the degree of transparency of a typical photomask can be changed in one or more regions without altering the essential optical conditions for performing the exposure process. Accordingly, after the initial arbitrary arrangement of the transparency-adjusting pattern features 200 (FIG. 4) is removed from the rear side of the substrate 100, for example, the final arrangement of the transparency-adjusting pattern features 200 that will compensate for differences in the critical dimensions that would otherwise be generated on the wafer using the photomask are laid out on the rear side of the photomask substrate 100, whereby the photomask will now produce a pattern in which the critical dimensions have a high degree of uniformity.

Hereinafter, techniques of improving shot uniformity using a photomask having transparency-adjusting pattern features 200 on the rear side of the photomask substrate 100 will be described in greater detail.

First Embodiment

Figure 7:
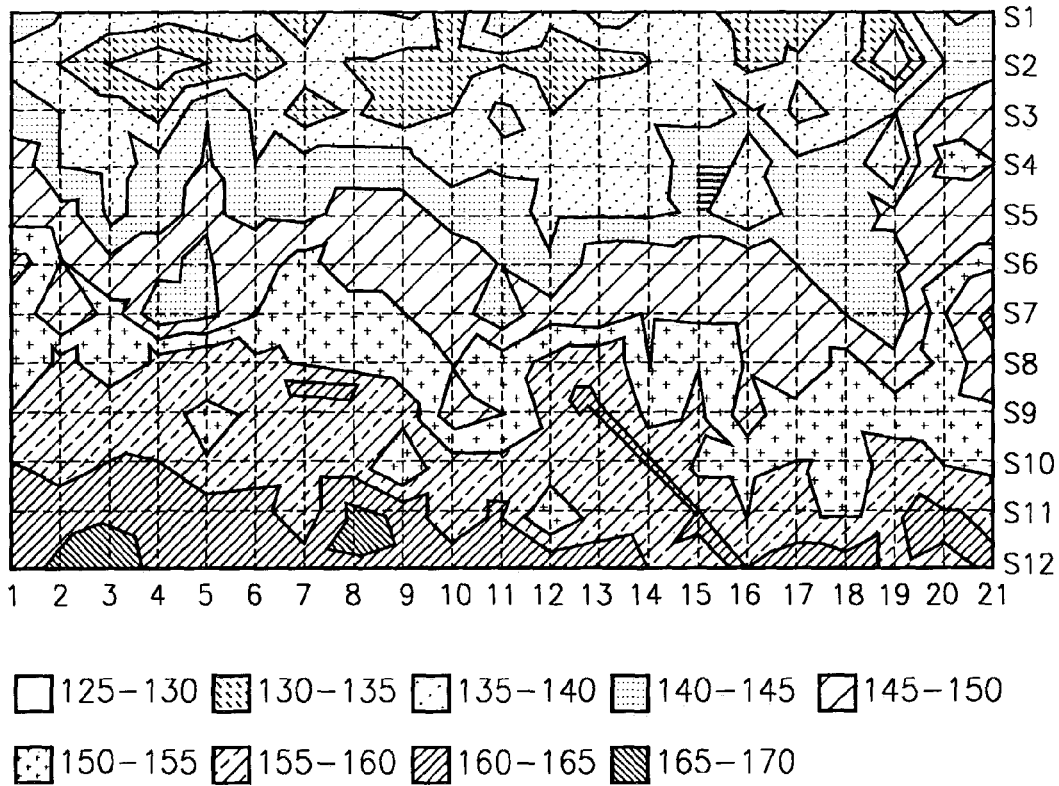
FIG. 7 is a diagram the distribution of critical dimensions in a pattern on an a region of a wafer exposed using a typical exposure process.

FIG. 7 illustrates the results of measuring critical dimensions of a pattern formed on a wafer through a typical exposure process before the process is corrected according to the present invention. In particular, FIG. 7 shows the magnitudes and distribution of critical dimensions of a pattern formed on a wafer through an exposure process using a conventional photomask having a design rule of 0.146 $\mu$m. The results of the measurements are shown in 5-nm wide groups ranging from 125–130 nm to 165–170 nm. The average of the critical dimensions is 148.1 nm, 3$\sigma$ of the distribution of the critical dimensions is 28.8 nm, and the range of the distribution of the critical dimensions is 43.1 nm.

Figure 8:
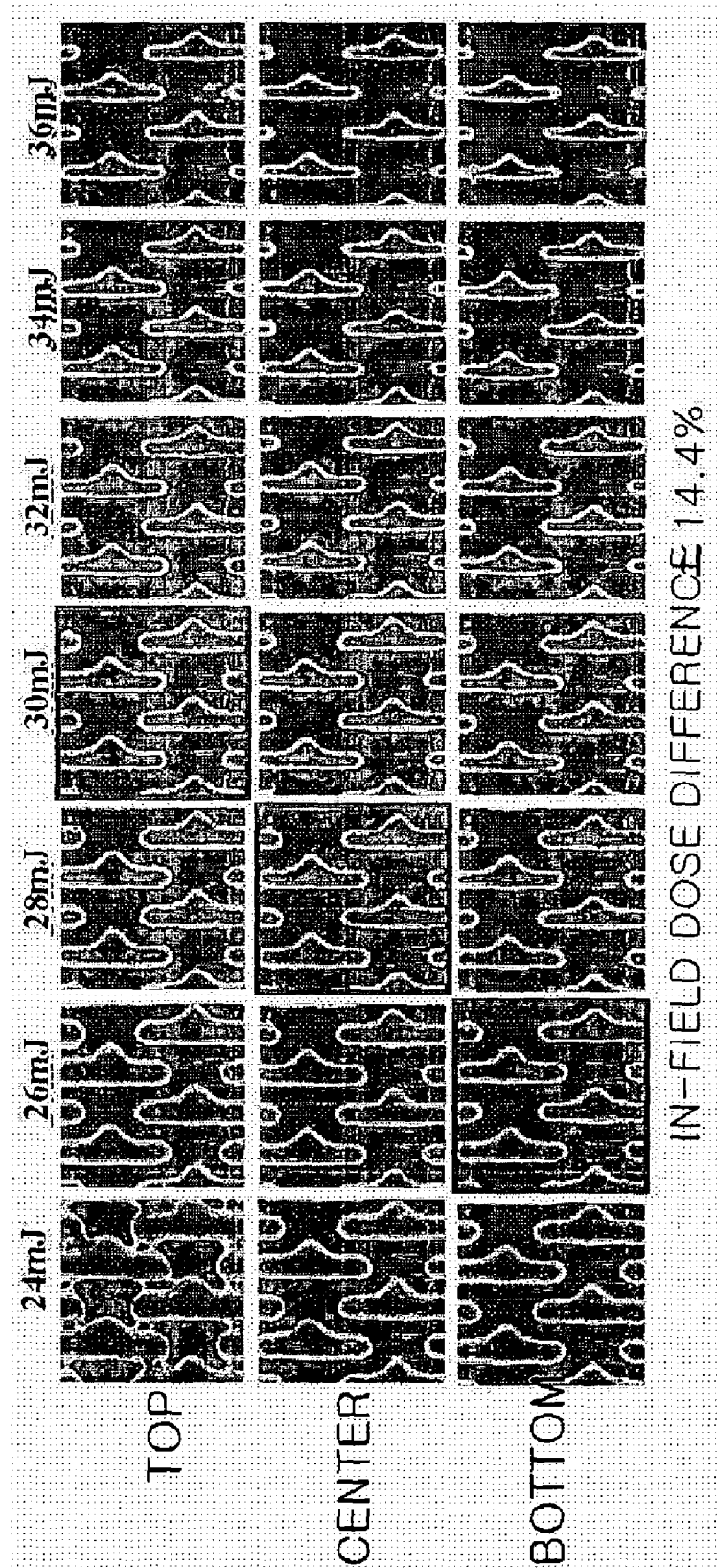
FIG. 8 is a diagram illustrating the pattern produced by the typical exposure process represented in FIG. 7, under different doses of illumination.

The critical dimensions become greater closer to the bottom of the distribution shown in FIG. 7. In other words, FIG. 7 shows that the measured critical dimensions become greater in a direction from the top to the bottom of the distribution. FIG. 8 illustrates representative doses of exposure light in relation to the regions of the critical dimension distribution shown in FIG. 7, namely the top, middle, and bottom regions of the critical dimension distribution shown in FIG. 7. The figure shows that the most appropriate exposure light doses are 30 mJ, 28 mJ, and 26 mJ, respectively. The appropriate exposure light doses are those that only decrease slightly from the top to bottom regions of the critical dimension distribution shown in FIG. 7. From FIG. 8 the in-field dose difference amounts to about 14.4%, and the optimum exposure light dose is estimated at 28 mJ.

According to the present invention, transparency-adjusting pattern features are provided on the rear side of the photomask substrate to correct for the differences among the critical dimensions shown in FIG. 7. This correction method will be described in greater detail below with reference to FIGS. 9 through 14.

Figure 9:
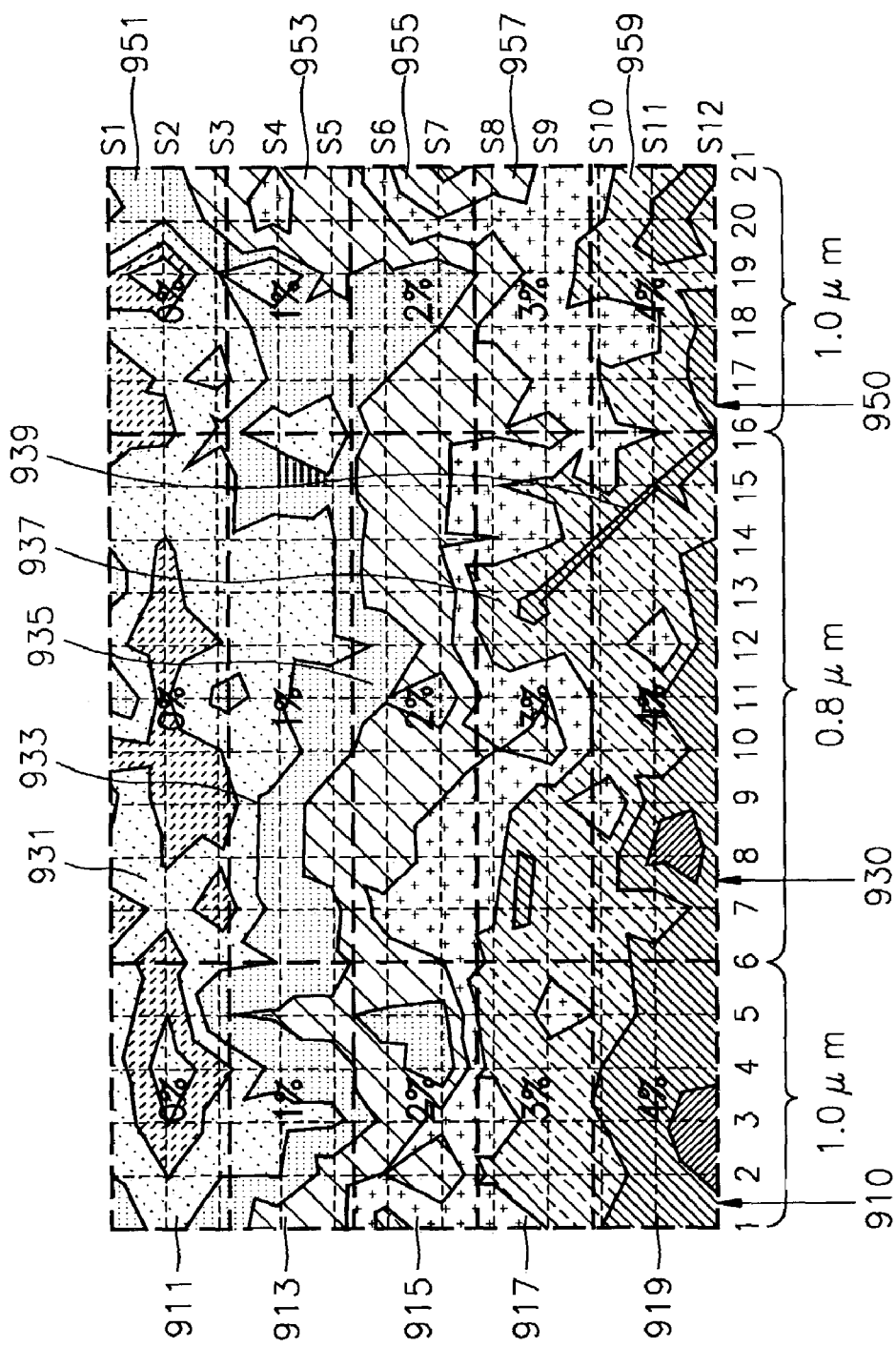
FIG. 9 is a diagram corresponding to FIG. 7 but illustrating the dividing of the exposed region into unit areas for which corresponding sets of transparency-adjusting pattern features will be respectively designed according to the present invention.

Referring first to FIG. 9, the exposed region having the critical dimension distribution shown in FIG. 7 is divided into a set of unit areas. For example, as shown in FIG. 9, the exposed region is divided into about 15 unit areas arranged in five rows (unnumbered) and three columns 910, 930 and 950. Each of the unit areas may have a mesh having a size of 1 mm. The size of the unit areas is set in consideration of the spatial resolution of the exposure process and the characteristics of the illumination, in this case of the annular for of the illumination, and the photomask. In an example of the first embodiment of the present invention, the photomask is designed for use in an optical system having a numerical aperture (NA) of 0.7 and producing illumination having an annular form of 0.55–0.85. Such an annular illumination system can provide a spatial resolution of about 1.26 mm. Also, the exposed region is preferably divided in such a way that each of the unit areas has an almost uniform distribution of critical dimensions.

Here, however, for convenience, the exposed region shown in FIG. 9 has been arbitrarily divided. In this case, the exposed region is divided vertically in five because the critical dimensions become greater when moving closer to the bottom region of the critical dimension distribution shown in FIG. 7, whereas the exposed region is divided horizontally only in three merely to show the influence of the size of the transparency-adjusting pattern features 200 in correcting for the differences in the critical dimensions.

Given the critical dimension distribution, the intensity of the illumination of the five unit areas 911, 913, 915, 917, and 919 in the first column 910 will be decreased by transparency-adjusting pattern features from area to area in sequence (from the top area 911 to the bottom area 919). On the other hand, the intensity of the illumination will be uniform within each of the unit areas 911, 913, 915, 917, and 919. This technique is also applied to the second column 930 of five unit areas 931, 933, 935, 937, and 939. However, the size of the transparency-adjusting pattern features used in the exposure of the second column 930 is different from the size of the transparency-adjusting patterns used in the exposure of the first column 910. The third column 950 of five unit areas 951, 953, 955, 957, and 959 is illuminated in the same manner as the first column 910.

The degree to which the intensity of illumination is to be modified is set for each of the 15 unit areas based on a critical dimension of that portion of the pattern formed in the unit area or on the difference between the critical dimension and a reference critical dimension. For example, there is no need to decrease the intensity of the illumination of the areas 911, 931, and 951 at the top of the exposure region. In other words, the intensity of the illumination will be modified by 0% by the photomask at this portion of the exposure region. Accordingly, a critical dimension corresponding to that produced in the top areas 911, 931, and 951 is set as a reference critical dimension.

As there is no need to decrease the intensity of illumination in the top areas 911, 931, and 951, the density $$\left(\frac{p^2}{d^2}\right)$$

of transparency-adjusting pattern features at that part of the transparency-adjusting pattern layer corresponding to the top areas 911, 931, and 951 will be 0. However, the critical dimensions in the other areas are greater than those that were produced in the-areas 911, 931, and 951 at the top of the exposed region, as shown in FIG. 7. Accordingly, the density of the transparency-adjusting pattern features $$\left(\frac{p^2}{d^2}\right)$$

can be set to decrease the intensity of the illumination of these other areas of the wafer such that there will be no differences in the critical dimensions in the pattern formed at the exposed region.

For example, the density $$\left(\frac{p^2}{d^2}\right)$$

of the transparency-adjusting pattern features of the photomask may be varied in increments of 1% amongst sections of the photomask corresponding to the vertical divisions of the exposed region of the wafer, respectively. Accordingly, the transparency-adjusting pattern density values $$\left(\frac{p^2}{d^2}\right)$$

of 0%, 1%, 2%, 3%, or 4% are shown in FIG. 9 in relation to each of the unit areas.

The transparency-adjusting pattern density value $$\left(\frac{p^2}{d^2}\right)$$

of each section of the photomask corresponding to a unit area of the region of the-wafer to be exposed is designed for based on rule rather than being set arbitrarily. In particular, the transparency-adjusting pattern density values $$\left(\frac{p^2}{d^2}\right)$$

are selected on the basis of the differences in the critical dimensions of the pattern formed on the wafer as determined using a dose latitude D_L.

A dose latitude is obtained through measurements taken of an exposure process and can be expressed by $$\frac{\Delta CD(nm)}{\Delta \% \ dose}.$$

Mores specifically, when the exposure dose is varied while the other exposure conditions are held constant, the critical dimensions of the patterns formed under these conditions vary accordingly. The variations in the critical dimensions are then measured. Subsequently, a graph showing the variation of the critical dimensions with respect to changes in the exposure dose is constructed by plotting exposure dose values and critical dimension values along the X-axis and the Y-axis, respectively. The slope of the plot is determined and then multiplied by the exposure dose used in a current exposure process. The product of this calculation is the dose latitude. For example, if the plot on a graph of the variation of critical dimensions with respect to changes in exposure dose has a slope of 3.7 nm/mJ for a given exposure process, and the exposure dose used in an actual application of the exposure process is 47.5 mJ, then the dose latitude value for that exposure process is 1.76 nm/Δ% dose (=3.7 nm/mJ×47.5 mJ/100).

Supposing, for the sake of convenience in explaining the present invention, that the allowable dose latitude value in mass production is 2 nm/% dose and that a difference between a critical dimension in a specific unit area and a reference critical dimension is about 30 nm. In this case, the intensity of the illumination must be reduced by as much as about 15% if the exposure process is to form a pattern whose critical dimension in that specific area is the same as that of the reference critical dimension. Referring to FIG. 5, the use of transparency-adjusting pattern features having a pattern density value of 4% can create a 15% decrease in the intensity of the illumination directed through the photomask. The density of the transparency-adjusting features 200 in sections of the mask used to expose the unit areas, respectively, are set in this way.

Figure 10:
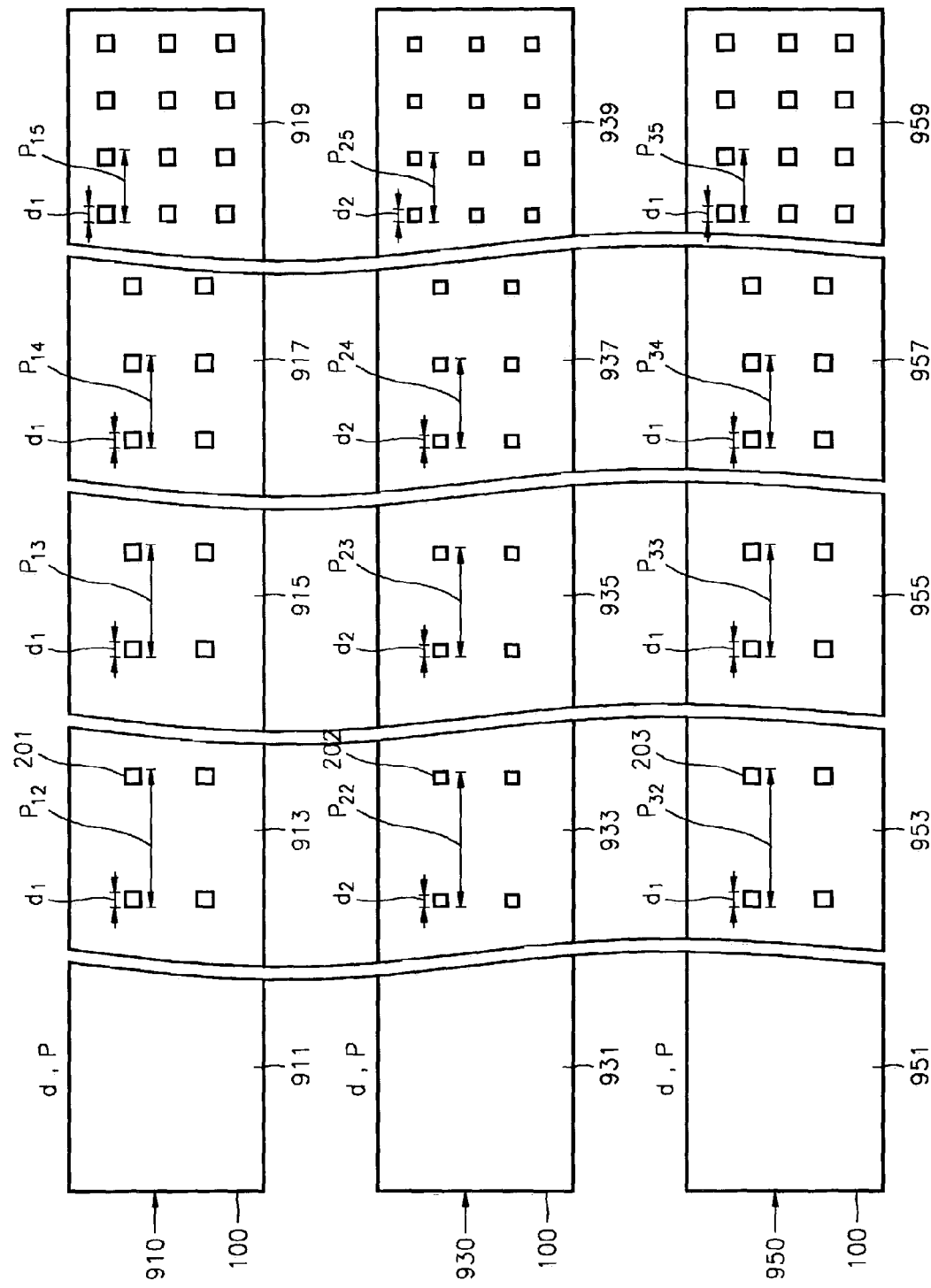
FIG. 10 is a schematic plan view of a photomask according to the present invention showing the transparency-adjusting pattern features designed for each unit area shown in FIG. 9 so as to correct for the critical dimension distribution shown in FIG. 7.

FIG. 10 is a plan view of transparency-adjusting pattern features as overplayed on each corresponding unit area of the exposure region of the wafer. The densities of the transparency-adjusting pattern features have been designed according to the process described above so as to constitute a transparency-adjusting pattern layer that will produce on a wafer a pattern having a high degree of uniformity in its critical dimensions. For example, the pattern density value for the portion of the transparency-adjusting pattern layer used to expose unit area 911 shown in FIG. 10 is 0%. Hence, given the fact that the pattern density value is a factor of $$\frac{d^2}{p^2},$$

no transparency-adjusting pattern features 200 are formed in this section of the photomask.

On the other hand, the section of the photomask dedicated to expose the unit area 913 is to have a pattern density of 1% as shown in FIG. 9. The transparency-adjusting pattern features 201 in the section of the photomask used to expose the areas on the wafer in the first column 910 each have a size (d1) of 1.0 μm, as indicated in the figure. In this case, the transparency-adjusting pattern features 201 (FIG. 10) need to be spaced apart a distance $P_{12}$ of 10 μm to yield a pattern density value $$\frac{d^2}{p^2}$$

of 1%.

Transparency-adjusting pattern features 201 are also formed in the sections of the photomask corresponding to unit areas 915, 917, and 919. However, these features 201 are spaced from one another, in each section of the photomask, by distances $P_{13}$, $P_{14}$, and $P_{15}$, respectively, that are each different from the distance $P_{12}$.

Still referring to FIG. 10, transparency-adjusting pattern features 202 of a size $d_2$ are formed in the sections of the photomask corresponding to the second column 930 shown in FIG. 9. The distances $d_2$ by which the transparency-adjusting pattern features 202 are spaced differ amongst the respective sections corresponding to the unit areas 933, 935 and 939. Also, the size $d_2$ of the transparency-adjusting pattern features 202 is different from that of the transparency-adjusting pattern features 201. As shown in FIG. 9, the size $d_2$ of the transparency-adjusting patterns 202 is 0.8 μm. The transparency-adjusting pattern features 202 are spaced from one another in each section of the photomask corresponding to unit areas 933, 935, 937 and 939 by respective distances $P_{22}$, $P_{23}$, $P_{24}$, and $P_{25}$, so that the pattern density values vary amongst these sections by the percentages shown in FIG. 9.

Transparency-adjusting pattern features 203 having the size $d_1$ (1.0 μm) as those of the pattern features 210 are formed at the sections of the photomask corresponding to the unit areas 953, 955, 957, and 959 of the third column 950. The transparency-adjusting pattern features 203 are spaced from one another in each section of the photomask corresponding to unit areas 933, 935, 937 and 939 by respective distances $P_{32}$, $P_{33}$, $P_{34}$, and $P_{35}$ that differ from one another. This leads to different pattern density values in the different sections of the photomask corresponding to the unit areas 953, 955, 957, and 959.

More specifically, the density of the 1.0 μm transparency-adjusting pattern features and the density of the 0.8 μm transparency-adjusting pattern features are set to vary by 9.7% and 12.2%, respectively, throughout each section of the photomask corresponding to the corresponding column 910, 930 or 950. A photomask 100 designed in this way will decrease the intensity of illumination that passes therethrough within a range of 4%, i.e., the range shown in FIG. 9. The values of 9.7% and 12.2% are readily obtained from the graph of FIG. 5.

Figure 11:
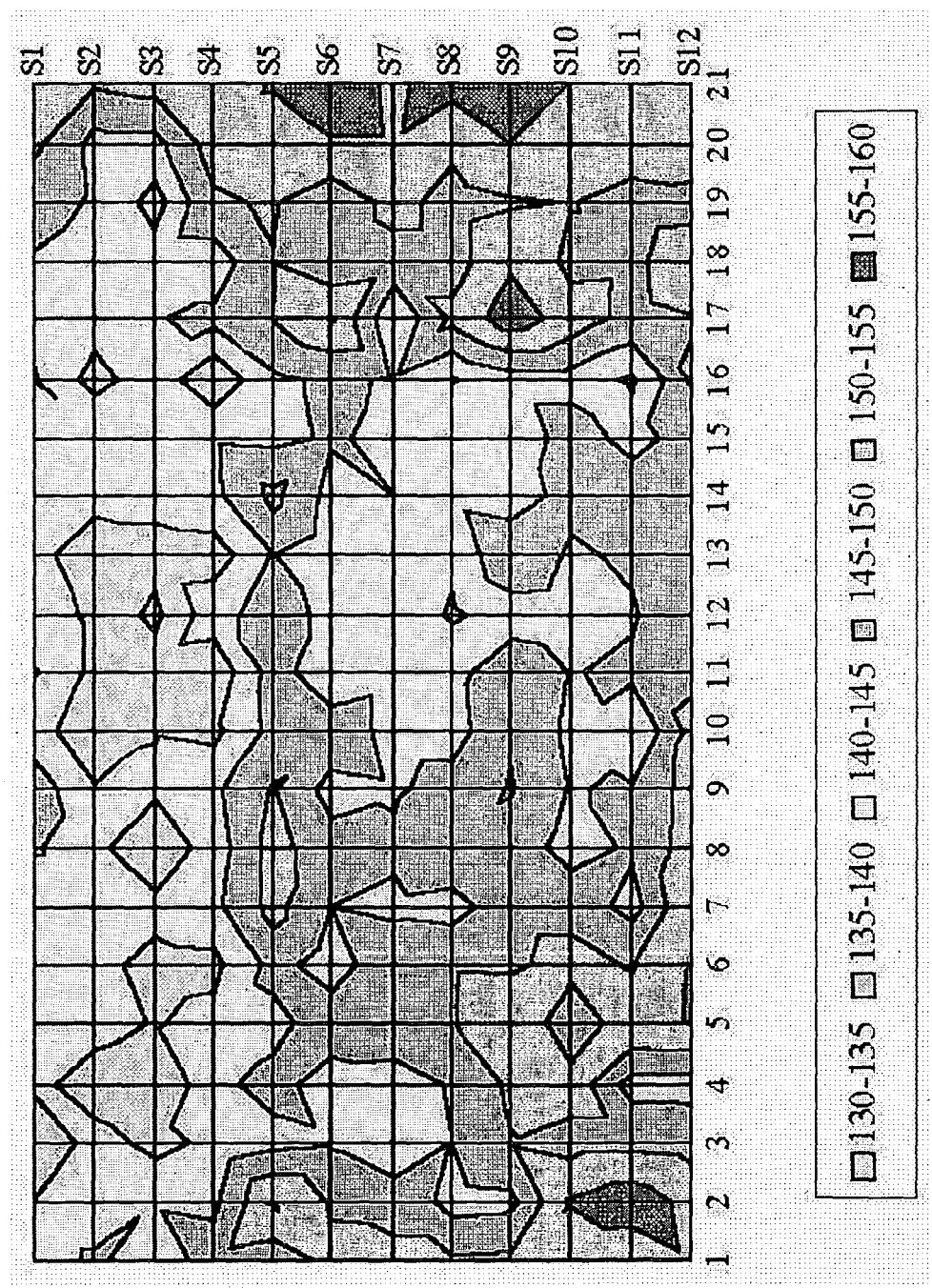
FIG. 11 is a diagram of the distribution of critical dimensions of a pattern formed on a wafer by an exposure process using a first embodiment of a photomask according to the present invention.

FIG. 11 shows the distribution of critical dimensions amongst the elements of a pattern formed on a wafer through an exposure process using a photomask having the transparency-adjusting layer shown in FIG. 10. In particular, FIG. 11 shows the distribution of critical dimensions of a pattern formed on a wafer using the same exposure process as represented in FIG. 7 and under the same illumination conditions but wherein the photomask has been corrected according to the present invention by providing the transparency-adjusting pattern features 201, 202 and 203 on the rear side of a photomask substrate 100. The main pattern 150 of the photomask used in the exposure process was designed for use in forming a pattern having a design rule of 0.146 μm at an active region of the wafer.

FIG. 11 shows the results of measuring the critical dimensions of the pattern formed on the wafer. These results are grouped into several 5-nm wide ranges from a 130–135 nm range to a 155–160 nm range. The average of the critical dimensions is 146.1 nm, 3σ of the critical dimension distribution is 15.3 nm compared to 28.8 nm in the case shown in FIG. 7, and the range of the critical dimension distribution is 24.3 nm. Also, the critical dimension distribution is highly uniform especially in the portion of the exposed region corresponding to the second column 930 shown in FIG. 9.

The size of the transparency-adjusting pattern features 202 at the section of the photomask corresponding to this portion of the exposed region is about 800 nm. Moreover, the distribution of the critical dimensions is more uniform than in the other portions of the exposed region corresponding to the first and third columns 910 and 950. Accordingly, FIG. 11 shows that the transparency-adjusting pattern features according to the present invention can minimize differences among critical dimensions of a pattern formed on a wafer through a typical exposure process.

Figure 12:
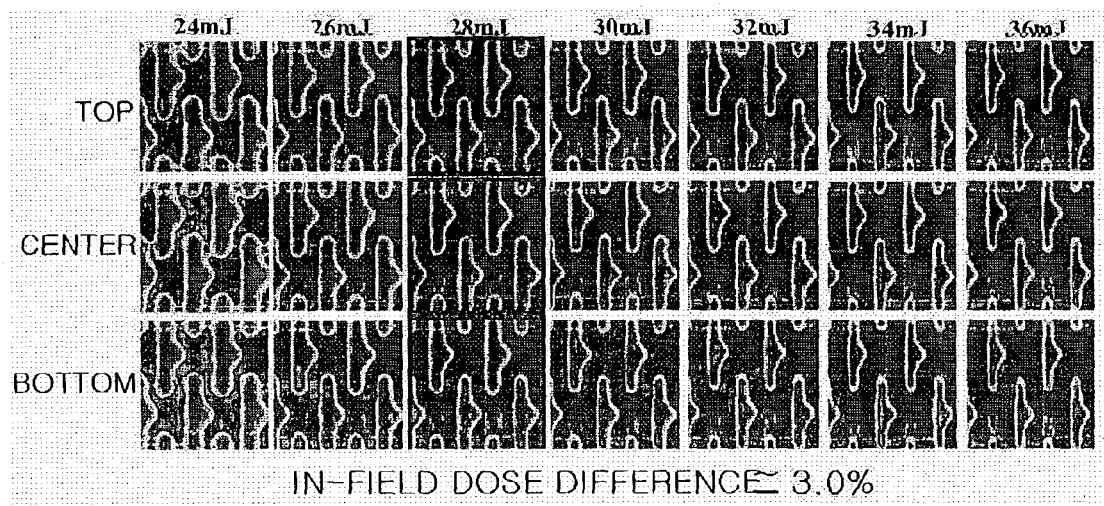
FIG. 12 is a diagram illustrating the pattern produced by the exposure process using the first embodiment of a photomask according to the present invention, under different doses of illumination.

FIG. 12 illustrates the pattern having the critical dimension distribution shown in FIG. 11, as produced under different doses. FIG. 12 shows that an exposure dose of about 28 mJ minimizes pattern variation. Actually, an exposure dose of about 28.4 mJ is considered to be optimal in this respect. In this case, a measured in-field dose difference is about 3.0%, which shows great improvement versus the in field dose difference of 14.4% shown in FIG. 8.

Figure 13:
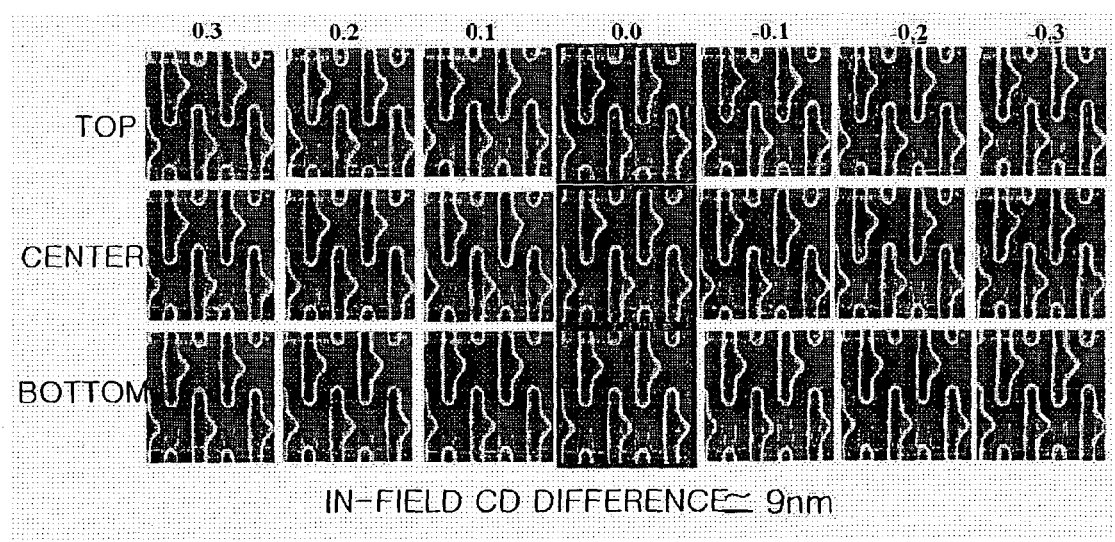
FIG. 13 is a diagram illustrating the pattern produced by the exposure process using the first embodiment of a photomask according to the present invention, under different depths-of-focus (DOF)

FIG. 13 illustrates the pattern having the critical dimension distribution shown in FIG. 11, as produced under different depths-of-focus (DOF) margins. As shown in FIG. 13, a measured in-field dose is about 9 nm when the DOF margin is optimal. The DOF margin is considered to be unaffected by the presence of the transparency-adjusting pattern features of the photomask. In other words, the transparency-adjusting pattern features do not affect the DOF margins negatively.

Figure 14:
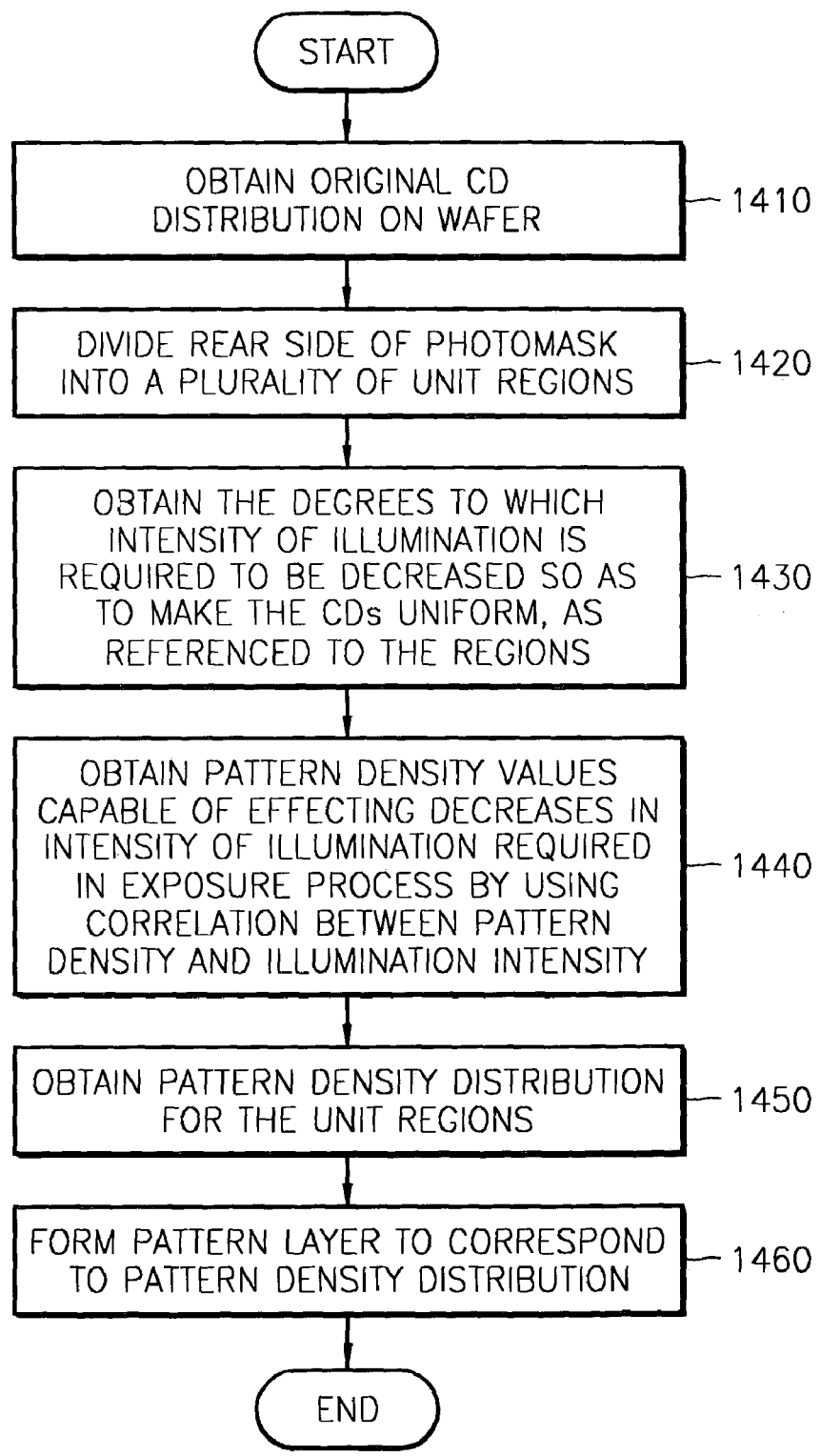
FIG. 14 is a flowchart of a first embodiment of a method of forming transparency-adjusting pattern features according to the present invention.

A method of making a photomask according to the present invention will now be described with reference to FIG. 14. First, a wafer having a photoresist layer thereon is exposed and patterned using a typical photomask (one not having transparency-adjusting pattern features). Critical dimensions of the pattern are measured. The measurements are grouped together to show the distribution of the critical dimensions of the pattern in, for example, the form of a critical dimension map of the wafer (step 1410). If necessary, the results of the measurement of the critical dimensions may be processed to filter out those values having an abnormally high deviation from the norm to prevent the resulting critical dimension distribution from being unduly distorted by those values.

A dose latitude (ΔCD/Δ% dose) of the exposure process used to: pattern the wafer and the characteristics of the illumination and its source (for example, the shape of the illumination, the NA of the system, and σ) are obtained. Subsequently, the rear side of the photomask is divided into a plurality of unit regions (step 1420), and then a pattern density value is determined for each of the unit regions as follows.

The value of a critical dimension of each part of the pattern formed in a respective unit area of the critical dimension map is compared to a reference critical dimension value. Then, amounts by which the intensity of the illumination should be decreased in order to compensate for the difference between the measured values of the critical dimensions and the reference critical dimension value are determined using the dose latitude (step 1430). The amounts by which the intensity of illumination is required to decrease in order to create a uniform distribution of critical dimensions are used, in turn, to obtain the transparency-adjusting pattern density values (step 1440) based on the correlation between pattern density and the intensity of illumination shown in FIG. 5.

The transparency-adjusting pattern density values are assigned to the unit regions of the photomask corresponding to the unit areas of the exposed region of the wafer to thereby provide a distribution of the of the transparency-adjusting pattern density values for the photomask (step 1450). The rear side of the photomask is then patterned according to the distribution of the transparency-adjusting pattern density values (step 1460), thus forming a transparency-adjusting pattern layer at the rear side of the photomask.

Second Embodiment

Figure 15:
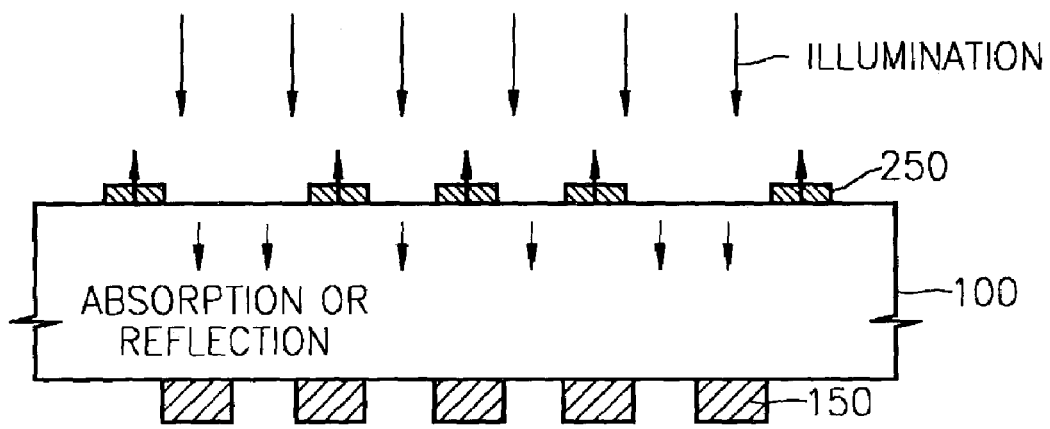
FIG. 15 is a cross-sectional view of a second embodiment of a photomask according to the present invention.

In the second embodiment of the present invention shown in FIG. 15, the transparency-adjusting pattern layer is in the form of a patterned layer of material formed on a rear side of a photomask substrate.

More specifically, a shielding layer is formed on a rear side of a photomask substrate 100. The photomask substrate 100 is a transparent substrate, for example, a quartz substrate, bearing a main pattern 150 that is to be transferred to a wafer. The shielding layer may be formed of a material, such as chromium (Cr), that can either reflect light or can absorb the light. The shielding layer is patterned thus forming transparency-adjusting pattern features 250.

The transparency-adjusting pattern features 250 reduce the intensity of light incident on the main patterns 150 by reflecting or absorbing the light incident on the rear side of the photomask. Accordingly, the transparency-adjusting pattern features 250 produce an exposure dose distribution across the wafer, similar to the recesses constituting the transparency-adjusting pattern features 200.

The transparency-adjusting pattern features 250 are sized and arrayed according to the critical dimension distribution of a pattern formed by an exposure process using a photomask that does not having such transparency-adjusting pattern features. In other words, a distribution of pattern density values is obtained in the manner described above with reference to FIGS. 7 through 14, and then the size (d) of the transparency-adjusting pattern features 250 and the spacing or pitch (p) of the transparency-adjusting patterns 250 are determined based on the pattern density distribution values. Subsequently, the transparency-adjusting pattern features 250 are formed on the rear side of the photomask substrate 100 according to the distribution of pattern density values to provide for a more uniform critical dimension distribution for the pattern that will be formed on the wafer using the photomask.

Third Embodiment

Figure 16:
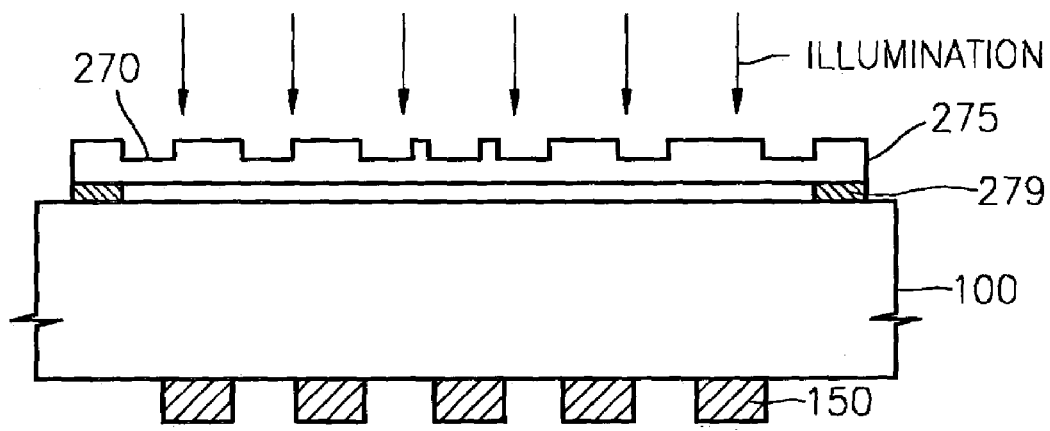
FIG. 16 is a cross-sectional view of a third embodiment of a photomask according to the present invention.

The first and second embodiments of the present invention entail photomasks wherein transparency-adjusting pattern features are provided at the rear side of the substrate of the photomask. In the third embodiment of the present invention, an auxiliary mask substrate 275 having transparency-adjusting pattern features 270 is attached to the rear side of a photomask substrate, as shown in FIG. 16.

The photomask substrate 100 is a transparent substrate, for example, a crystalline substrate. As was described above, the main pattern 150 to be transferred to a wafer is formed on the front side of the photomask substrate 100. The auxiliary mask substrate 275 may be bonded to the photomask substrate 100, at the rear side of the photomask substrate 100, by bonding material 279.

The transparency-adjusting pattern features 270 are recesses formed in the rear side of the auxiliary mask substrate 275. In this case, light passing through the recesses is out of phase with respect to light passing through other regions on the auxiliary mask substrate 275 that do not have the recesses. The phase difference between light passing through the recesses and light passing through the other regions preferably is about 180° but may have a different value depending on the depth of the recesses.

The transparency-adjusting pattern features 270 are sized and arrayed according to the critical dimension distribution of a pattern formed by an exposure process using a photomask that does not having such transparency-adjusting pattern features. In other words, a distribution of pattern density values is obtained in, the manner described above with reference to FIGS. 7 through 14, and then the size (d) of the transparency-adjusting pattern features 270 and the spacing or pitch (p) of the transparency-adjusting patterns 270 are determined based on the pattern density distribution values. Subsequently, the transparency-adjusting pattern features 270 are formed on the rear side of the auxiliary mask substrate 275 according to the distribution of pattern density values to provide for a more uniform critical dimension distribution for the pattern that will be formed on the wafer using the photomask.

Fourth Embodiment

Figure 17:
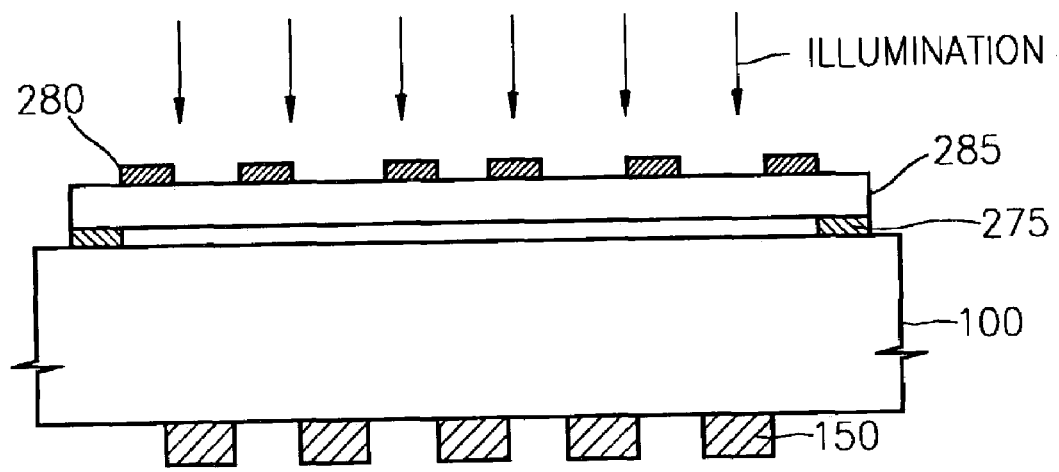
FIG. 17 is a cross-sectional view of a fourth embodiment of a photomask according to the present invention.

In the fourth embodiment of the present invention, a shielding layer comprising the transparency-adjusting pattern features 280 is formed on an auxiliary mask substrate 285, as shown in FIG. 17. The auxiliary mask substrate 285 is attached to the rear side of a photomask substrate 100. The photomask substrate 100 is a transparent substrate, for example, a crystalline substrate. As was described above, the main pattern 150 to be transferred to a wafer is formed on the front side of the photomask substrate 100. The auxiliary mask substrate 285 may be bonded to the photomask substrate 100 at the rear side of the photomask substrate 100, by bonding material 279.

More specifically, the transparency-adjusting pattern features 280 are formed on a rear side of an auxiliary mask substrate 285, which is transparent. The transparency-adjusting pattern features 280 act as light shields on the auxiliary mask substrate 285. That is, the transparency-adjusting pattern features 280 perform the same function as those of the shielding layer 250 described above with reference to FIG. 15 in terms of reflecting or absorbing incident light.

The transparency-adjusting pattern features 280 are sized and arrayed according to the critical dimension distribution of a pattern formed by an exposure process using a photomask that does not having such transparency-adjusting pattern features. In other words, a distribution of pattern density values is obtained in the manner described above with reference to FIGS. 7 through 14, and then the size (d) of the transparency-adjusting pattern features 280 and the spacing or pitch (p) of the transparency-adjusting patterns 280 are determined based on the pattern density distribution values. Subsequently, the transparency-adjusting pattern features 280 are formed on the rear side of the auxiliary mask substrate 285 according to the distribution of pattern density values to provide for a more uniform critical dimension distribution for the pattern that will be formed on the wafer using the photomask.

Fifth Embodiment

Figure 18:
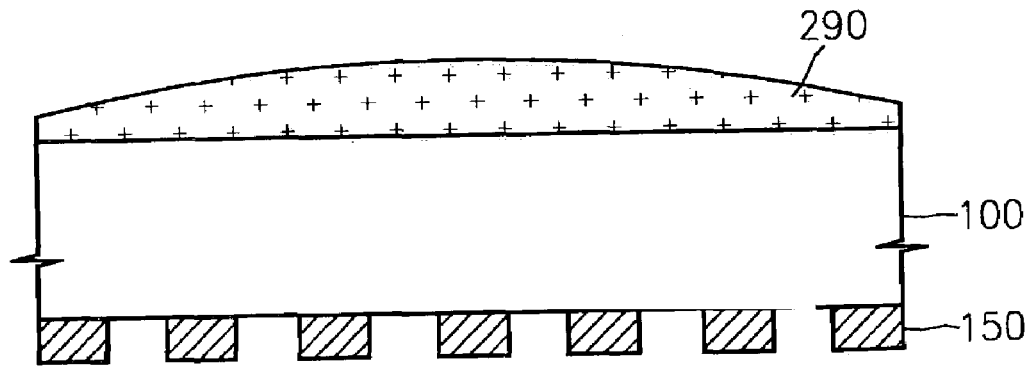
FIG. 18 is a cross-sectional view of a fifth embodiment of a photomask according to the present invention.

In a fifth embodiment of the present invention, a transparency-adjusting layer in the form of a light-absorption layer 290 is disposed on a rear side of a photomask substrate 100, as shown in FIG. 18.

More specifically, the light-absorption layer 290 is deposited on a rear side of a photomask substrate 100. The light-absorption layer 290 is of a material, such as chromium, having a light-absorbing characteristic such that the material is capable of changing the intensity of illumination directed through the rear side of the photomask. The light absorption layer 290 has a thickness that varies in accordance with the degrees to which the intensity of illumination needs to be decreased to provide for a more uniform critical dimension distribution for the pattern that will be formed on the wafer using the photomask.

For example, when the distribution of critical dimensions of a pattern formed on a wafer is represented by a parabola in a graph of the critical dimensions as shown in FIG. 1, the illumination intensity distribution for reducing the critical dimension differences can be represented by the curve which is shown in FIG. 2. The amount of light absorbed by the light-absorption layer 290 is proportional to the length of the optical paths along which light passes through the light absorption-layer 290. Accordingly, changes in the intensity of the illumination directed through the photomask, corresponding to the illumination intensity distribution curve shown in FIG. 2, can be obtained if the light absorption layer 290 is thicker at its middle than at its edges, as shown in FIG. 18.

The curved surface profile of the light-absorption layer 290 may be formed in the process of depositing the material of the light-absorption layer 290 on the photomask 100. In this case, the light-absorption layer 290 is formed by a process in which the deposition rate is greater in the middle of the photomask 100 than at an outer peripheral region of the photomask 100. Other surface profiles can, of course, be produced by appropriately varying the rates of deposition across the photomask 100.

Alternatively, the light-absorption layer 290 may be formed in a two step process, namely forming a layer of light-absorbing material having a uniform thickness on the substrate 100 and selectively etching the layer to remove a portion thereof. For instance, in the example described above, a layer of light-absorbing material having a uniform thickness is selectively etched by an etching process wherein more of the layer is etched away at the outer peripheral portions thereof than at a central portion thereof. Processes capable of selectivity etching parts of a homogenous layer are known, per se, and thus can be used to provide numerous variations in the thickness of the light-absorption layer 290 as desired.

It is thus clear that this embodiment of the present invention provides the same effects as the previous embodiments in terms of decreasing the intensity of illumination so as to produce a pattern on a wafer having a high degree of uniformity in its critical dimension.

According to the present invention as described above, the transparency-adjusting layer provided at the rear side of a photomask makes it possible to globally correct for differences among critical dimensions of a pattern that would otherwise be formed by the photomask in an exposure process, especially over a large area on the wafer. That is, the transparency-adjusting layer changes the intensity of the illumination, leading to a higher degree of uniformity in the critical dimensions of the pattern that can be formed on the wafer using the exposure process.

The present invention is advantageous in that it can effect the necessary changes in the intensity of the illumination without changing the illumination system itself of the exposure apparatus.

Finally, although the present invention has been particularly shown and described above with reference to the preferred embodiments thereof, it will be understood by those of ordinary skill in the art that various changes in form and details may be made thereto without departing from the true spirit and scope of the present invention as defined by the following claims.

What is claimed is:

1. A method of manufacturing a photomask, the method comprising:

providing a photomask that includes a substrate having a front side and a rear side, and a main pattern located at said front side of the substrate;

transferring an image of the main pattern to a wafer by directing illumination onto the wafer through said photomask in an exposure process, and using the image to produce a pattern on the wafer formed of elements having critical dimensions;

quantifying the critical dimensions to obtain a distribution of values of the critical dimensions on the wafer;

comparing the critical dimension values to a reference critical dimension value in order to as certain the differences therebetween;

determining, in relation to localities on the photomask, degrees to which the intensity of the illumination used in the exposure process would need to be decreased in order to reduce the differences, respectively, between the critical dimension values and the reference critical dimension value, to thereby obtain a distribution of said degrees in relation to said localities;

selecting transparency-adjusting pattern features that, if provided in a set at a rear side of the substrate of the photomask during the exposure process, would change the intensity of the illumination passing through the photomask during the exposure process due to the density of the features in terms of their size and spacing;

obtaining a correlation between the densities of the transparency-adjusting pattern features, in terms of their size and spacing, and the changes that the transparency-adjusting pattern features provided at those densities at the rear side of the substrate-would make in the intensity of the illumination directed therethrough during the exposure process;

based on said correlation, ascertaining the densities of the transparency-adjusting pattern features that correspond to said distribution of the degrees to which the intensity of the illumination needs to be decreased, to thereby obtain a distribution of-the densities-of the-transparency-adjusting pattern features in relation to said localities; and providing the transparency-adjusting pattern features at the rear side of the substrate in an arrangement corresponding to said distribution of the densities of the transparency-adjusting pattern features.

2. The method of claim 1, wherein the reference critical dimension value is the smallest of the critical dimension values.

3. The method of claim 1, wherein said obtaining a correlation between the densities of the transparency-adjusting pattern features and the changes that the transparency-adjusting pattern features would make in the intensity of the illumination during the exposure process comprises:

forming an arbitrary arrangement of the selected the transparency-adjusting pattern features at the rear side of the photomask substrate the arrangement comprising an arbitrary size of the transparency-adjusting pattern features spaced apart an arbitrary distance from each other;

using a Fourier transform, determining the intensity of illumination incident on the main pattern after the illumination has been modified by the arbitrary arrangement of the transparency-adjusting pattern features in the exposure process as a function of the size and the spacing of the arrangement of the selected the transparency-adjusting pattern features; and based on said functions obtaining a correlation between the densities of the transparency-adjusting pattern features, represented by $$\frac{(\text{the size of the features})^2}{(\text{the spacing of the features})^2},$$

and the changes that the transparency-adjusting pattern features would make in the intensity of the illumination during the exposure process.

4. The method of claim 3, wherein the intensity of illumination is represented by $$\frac{1 - 4(\text{the size of the features})^2}{(\text{the spacing of the features})^2}$$

in said function.

5. The method of claim 1, wherein said determining degrees to which the intensity of the illumination used in the exposure process would need to be decreased comprises:

ascertaining dose latitude values representative of variations in a critical dimension of a pattern formed by an exposure process with respect to changes in the dose of the illumination used to form the pattern; and calculating exposure dose variations, corresponding to the differences between the critical dimension values and the reference critical dimension value, using the dose latitude values and said differences.

6. The method of claim 1, wherein said providing the transparency-adjusting pattern features at the rear side of the substrate comprises etching the rear side of the substrate to form recesses therein.

7. The method of claim 1, wherein said providing the transparency-adjusting pattern features at the rear side of the substrate comprises forming over the rear side of the substrate a shielding layer of material that is opaque with respect to the illumination, and selectively etching the shielding layer.

8. The method of claim 7, wherein the shielding layer comprises chromium.

9. The method of claim 1, wherein said providing the transparency-adjusting pattern features at the rear side of the substrate the transparency-adjusting pattern layer comprises providing a transparent auxiliary mask substrate on the rear side of the photomask substrate, and forming the transparency-adjusting pattern features at one side of the auxiliary mask substrate.

10. The method of claim 9, wherein said forming of the transparency-adjusting pattern features comprises selectively etching the auxiliary mask substrate.

11. The method of claim 9, wherein said forming of the transparency-adjusting pattern features comprises forming a shielding layer of a material that is opaque with respect to the illumination over the rear side of the auxiliary mask substrate, and selectively etching the shielding layer.

12. The method of claim 11, wherein the shielding layer comprises chromium.

13. A method of manufacturing a photomask, the method comprising:
providing a photomask that includes a substrate having a front side and a rear side, and a main pattern located at said front side of the substrate; and
providing substrate transparency-adjusting pattern features, capable of changing the intensity of illumination directed through the rear side of the photomask and onto the main pattern, in respective sections at the rear side of the substrate, the transparency-adjusting pattern features having a density in each of the sections that is a function of the size and spacing of the features and is proportional to the change that the features will make in the intensity of the illumination when the illumination is directed through the rear side of the substrate, and
wherein the transparency-adjusting pattern features are provided in sets in said sections at the rear side of the substrate, respectively, such that the density of the set of the features in one of said sections differs from that of the set of features in another of said sections, whereby when the illumination is directed through the substrate from the rear side thereof with a uniform intensity, the intensity of the illumination incident on the main pattern has variations corresponding to the different densities, in each of the sections, of the respective sets of transparency-adjusting pattern features.

14. The method of claim 13, and further comprising transferring an image of the main pattern to a wafer by performing an exposure process in which the illumination is directed onto the wafer through the photomask, and developing the image to form a pattern on the wafer formed of elements having critical dimensions, before the transparency-adjusting pattern features are provided at the rear side of the substrate, and
wherein the different densities at which the transparency-adjusting pattern density values are provided are based upon a distribution of the critical dimensions of the elements of the pattern formed on the wafer by the transferring of the image of the main pattern to the wafer.

15. A method of manufacturing a photomask, the method comprising:
providing a photomask that includes a substrate having a front side and a rear side, and a main pattern located at said front side of the substrate;
dividing a region at the rear side of the substrate into a plurality of sections including a first section and a second section; and
providing a transparency-adjusting pattern layer, capable of changing the intensity of illumination directed through the rear side of the photomask and onto the main pattern, in said sections at the rear side of the substrate such that a first part of said transparency-adjusting pattern layer resides in said first section and a second part of said transparency-adjusting pattern layer resides in said second section, and
wherein said first part of the transparency-adjusting pattern layer is formed at said first section with uniform characteristics with respect to its ability to change the intensity of that portion of the illumination passing through the first section, said second part of the transparency-adjusting pattern layer is formed at said second section with uniform characteristics with respect to its ability to change the intensity of that portion of the illumination passing through the second section, and the characteristics of said first part of the transparency-adjusting pattern layer in said first section are different from the characteristics of said second part of the transparency-adjusting pattern layer in said second section, whereby when illumination is directed through the rear side of the substrate and onto the main pattern, the intensity of the illumination passing through the first section and incident on the main pattern differs from the intensity of the illumination passing through the second section and incident on the main pattern.

16. The method of claim 15, and further comprising transferring an image of the main pattern to a wafer by performing an exposure process in which the illumination is directed onto the wafer through the photomask, and developing the image to form a pattern on the wafer formed of elements having critical dimensions, before the transparency-adjusting pattern layer is provided at the rear side of the substrate, and
wherein the different characteristics of the first and second parts of the transparency-adjusting pattern layer are provided based upon a distribution of the critical dimensions of the elements on the of the pattern formed on the wafer by the transferring of the image of the main pattern to the wafer.

17. A method of manufacturing a photomask, the method comprising:
providing a photomask that includes a substrate having a front side and a rear side, and a main pattern located at said front side of the substrate;
transferring an image of the main pattern to a wafer by directing illumination onto the wafer through said photomask in an exposure process, and using the image to produce a pattern on the wafer formed of elements having critical dimensions;
quantifying the critical dimensions to obtain a distribution of values of the critical dimensions on the wafer;
comparing the critical dimension values to a reference critical dimension value in order to ascertain the differences therebetween;
determining, in relation to localities on the photomask, degrees to which the intensity of the illumination used in the exposure process would need to be decreased in order to reduce the differences, respectively, between the critical dimension values and the reference critical dimension value, thereby obtaining a distribution of said degrees in relation to said localities; and
providing a light-shielding layer, having a light-absorbing characteristic, on a rear side of the photomask substrate so that the intensity of the illumination directed through the rear side of the substrate and onto the main pattern will be reduced by the light-shielding layer, and
wherein the light-absorbing characteristic is varied across said light-shielding layer in correspondence with said distribution of the degrees to which the intensity of illumination needs to be decreased.

18. The method of claim 17, wherein the light-absorbing characteristic is proportional to the thickness of said light-shielding layer, and said providing a shielding layer comprises forming the light-shielding layer with a thickness that varies in correspondence with said distribution of the degrees to which the intensity of illumination needs to be decreased.

19. A photomask comprising:
a photomask substrate having a front side and a rear side;
a main mask pattern disposed on the front side of said substrate; and
a transparency-adjusting pattern layer disposed on a rear side of said substrate,
said transparency-adjusting pattern layer including sets of transparency-adjusting pattern features, capable of changing the intensity of illumination directed through the rear side of the photomask and onto the main pattern, in respective sections at the rear side of the substrate,
each set of the transparency-adjusting pattern features having a density in that is a function of the size and spacing of the features and is proportional to the change that the features will make in the intensity of the illumination when the illumination is directed through the respective section at the rear side of the substrate, and
the density of the set of said transparency-adjusting pattern features in one of said sections being different from that of the set of transparency-adjusting pattern features in another of said sections, whereby when the illumination is directed through the photomask substrate from the rear side thereof with a uniform intensity, the intensity of the illumination incident on the main pattern has variations corresponding to the different densities, in each of the sections, of the respective sets of said transparency-adjusting pattern features.

20. The photomask of claim 19, wherein the densities of the sets of the transparency-adjusting pattern features vary within a range of about 0–5% amongst said sections at the rear side of the photomask substrate.

21. The photomask of claim 19, wherein the transparency-adjusting pattern features each have a size wherein the maximum width is about 0.8 $\mu$m.

22. The photomask of claim 19, wherein the transparency-adjusting pattern features are recesses in the rear side of said photomask substrate.

23. The photomask of claim 19, wherein the transparency-adjusting pattern features comprise material capable of reflecting or absorbing the illumination incident thereon.

24. The photomask of claim 23, wherein said material is chromium.

25. The photomask of claim 19, and further comprising a transparent auxiliary mask substrate disposed on the rear side of said photomask substrate, and wherein the transparency-adjusting pattern features are located on said auxiliary mask substrate.

26. The photomask of claim 25, wherein the transparency-adjusting pattern features are-recesses in one side of the auxiliary mask substrate.

27. The photomask of claim 25 wherein the transparency-adjusting patterns comprise material covering a side of said auxiliary mask substrate and capable of reflecting or absorbing the illumination incident thereon.

28. The photomask of claim 27, wherein said material is chromium.

29. A photomask comprising:
a photomask substrate having a front side and a rear side;
a main mask pattern disposed on the front side of said substrate; and
a transparency-adjusting pattern layer disposed on a rear side of said substrate,
said transparency-adjusting pattern layer being capable of changing the intensity of illumination directed through the rear side of the photomask and onto the main pattern, a first part of said transparency-adjusting pattern layer residing in a first section of a region at the rear side of said mask substrate, and a second part of said transparency-adjusting pattern layer residing in a second section of said region,
said first part of the transparency-adjusting pattern layer in said first section having uniform characteristics with respect to its ability to change the intensity of that portion of the illumination passing through the first section, said second part of the transparency-adjusting pattern layer having uniform characteristics with respect to its ability to change the intensity of that portion of the illumination passing through the second section, and the characteristics of said first part of the transparency-adjusting pattern layer in said first section being different from the characteristics of said second part of the transparency-adjusting pattern layer in said second section, whereby when illumination is directed through the rear side of said photomask substrate and onto the main pattern, the intensity-of the illumination passing through the first section and incident on the main pattern will differ from the intensity of the illumination passing through the second section and incident on the main pattern.

30. An exposure method for use in photolithography, the method comprising:
providing a photomask that includes a substrate having a front side and a rear side, and a main pattern located at said front side of the substrate;
transferring an image of the main pattern to a wafer by directing illumination onto the wafer through said photomask in a first exposure process, and using the image to produce a pattern on the wafer formed of elements having critical dimensions;
quantifying the critical dimensions to obtain a distribution of values of the critical dimensions on the wafer;
comparing the critical dimension values to a reference critical dimension value in order to ascertain the differences therebetween;
determining, in relation to localities on the photomask, degrees to which the intensity of the illumination used in the exposure process would need to be decreased in order to reduce the differences, respectively, between the critical dimension values and the reference critical dimension value, thereby obtaining a distribution of said degrees in relation to said localities;
providing a transparency-adjusting layer on the rear side of the photomask substrate, the transparency-adjusting layer being capable of changing the intensity of illumination directed through the rear side of the photomask and onto the main pattern, and
wherein the characteristics of the transparency-adjusting layer with respect to its ability to change the intensity of the illumination are varied in accordance with said distribution of the degrees to which the intensity of the illumination used in the exposure process needs to be decreased; and
subsequently transferring the image of the main pattern onto a wafer by performing a second exposure process using the photomask substrate having the transparency-adjusting layer at the rear side thereof.

31. The method of claim 30, wherein the reference critical dimension value is the smallest of the critical dimension values.

32. The method of claim 30, and further comprising:

selecting transparency-adjusting pattern features that, if provided in a set at a rear side of the substrate of the photomask during the exposure process, would change the intensity of the illumination passing through the photomask during the exposure process due to the density of the features in terms of their size and spacing;

obtaining a correlation between the densities of the transparency-adjusting pattern features, in terms of their size and spacing, and the changes that the transparency-adjusting pattern features provided at those densities at the rear side of the substrate would make in the intensity of the illumination directed therethrough during the exposure process; and based on said correlation, ascertaining the densities of the transparency-adjusting pattern features that correspond to said distribution of the degrees to which the intensity of the illumination needs to be decreased, to thereby obtain a distribution of the densities of the transparency-adjusting pattern features in relation to said localities, and wherein said providing a transparency-adjusting layer comprises providing sets of the transparency-adjusting pattern features in sections of a region at the rear side of the photomask substrate, respectively, and laying out the sets of the transparency-adjusting pattern features in said sections, respectively, such that the densities of the respective sets thereof have a correspondence with said distribution of the densities obtained based on said correlation.

33. The method of claim 32, wherein said obtaining a correlation between the densities of the transparency-adjusting pattern features and the changes that the transparency-adjusting pattern features would make in the intensity of the illumination during the exposure process comprises:

forming an arbitrary arrangement of the selected the transparency-adjusting pattern features at the rear side of the photomask substrate, the arrangement comprising an arbitrary size of the transparency-adjusting pattern features spaced apart an arbitrary distance from each other;

using a Fourier transform, determining the intensity of illumination incident-on the main pattern after the illumination has been modified by the arbitrary arrangement of the transparency-adjusting pattern features in the exposure process as a function of the size and the spacing of the arrangement of the selected the transparency-adjusting pattern features; and based on said function, obtaining a correlation between the densities of the transparency-adjusting pattern features, represented by $$\frac{(\text{the size of the features})^2}{(\text{the spacing of the features})^2},$$

and the changes that the transparency-adjusting pattern features would make in the intensity of the illumination during the exposure process.

34. The method of claim 33, wherein the intensity of illumination is represented by $$\frac{1 - 4(\text{the size of the features})^2}{(\text{the spacing of the features})^2}$$

in said function.

35. The method of claim 32, wherein said determining degrees to which the intensity of the illumination used in the exposure process would need to be decreased comprises:

ascertaining dose latitude values representative of variations in a critical dimension of a pattern formed by an exposure process with respect to changes in the dose of the illumination used to form the pattern; and calculating exposure dose variations, corresponding to the differences between the critical dimension values and the reference critical dimension value, using the dose latitude values and said differences.

36. The method of claim 32, wherein the second exposure process is performed using the same form and type of illumination as used in the first exposure process.

* * * * *